(12) United States Patent
Masuda

(10) Patent No.: US 8,829,362 B2
(45) Date of Patent: Sep. 9, 2014

(54) ELECTRONIC DEVICE HAVING MEMBER WHICH FUNCTIONS AS GROUND CONDUCTOR AND RADIATOR

(75) Inventor: Satoshi Masuda, Atsugi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/571,145

(22) Filed: Aug. 9, 2012

(65) Prior Publication Data

US 2013/0081867 A1  Apr. 4, 2013

(30) Foreign Application Priority Data

Sep. 30, 2011  (JP) .................................. 2011-217484

(51) Int. Cl.
| | | |
|---|---|---|
| *H05K 1/11* | (2006.01) | |
| *H01L 23/66* | (2006.01) | |
| *H01L 23/367* | (2006.01) | |
| *H01L 25/07* | (2006.01) | |
| *H01L 23/498* | (2006.01) | |
| *H01L 23/50* | (2006.01) | |

(52) U.S. Cl.
CPC ... *H01L 23/3677* (2013.01); *H01L 2224/48227* (2013.01); *H01L 23/66* (2013.01); *H01L 2224/48091* (2013.01); *H01L 23/49838* (2013.01); *H01L 2224/48195* (2013.01); *H01L 23/50* (2013.01); *H01L 2224/48464* (2013.01); *H01L 2924/19107* (2013.01); *H01L 2924/19105* (2013.01); *H01L 2924/3011* (2013.01); *H01L 2924/1423* (2013.01); *H01L 2224/48137* (2013.01); *H01L 2924/15157* (2013.01); *H01L 25/072* (2013.01)
USPC .......................................... 174/266; 361/753

(58) Field of Classification Search
USPC ................. 174/266, 250, 255, 260, 261, 262; 361/679.01, 748, 752, 753, 760, 761, 361/764
See application file for complete search history.

(56) References Cited

U.S. PATENT DOCUMENTS

2003/0024732 A1* 2/2003 Ninomiya ..................... 174/255

FOREIGN PATENT DOCUMENTS

| JP | 10-242377 | 9/1998 |
|---|---|---|
| JP | 2003-179181 | 6/2003 |

* cited by examiner

*Primary Examiner* — Tremesha S Willis
(74) *Attorney, Agent, or Firm* — Fujitsu Patent Center

(57) ABSTRACT

An electronic device including a first ground conductor layer positioned at an underside of a first insulation layer; a second ground conductor layer positioned at an upper side of the first insulation layer; a second insulation layer positioned at an upper side of the second ground conductor layer; a first connection pattern formed on an inside wall of a first opening penetrating the first insulation layer and the second insulation layer and interconnecting the first ground conductor layer and the second ground conductor layer; a conductive member provided in the first opening and connected to the first ground conductor layer; and an electronic element mounted on the member and grounded to the member.

12 Claims, 25 Drawing Sheets

ELECTRONIC DEVICE HAVING MEMBER WHICH FUNCTIONS AS GROUND CONDUCTOR AND RADIATOR

CROSS-REFERENCE TO RELATED APPLICATION

This application is based upon and claims the benefit of priority of the prior Japanese Patent Application No. 2011-217484, filed on Sep. 30, 2011, the entire contents of which are incorporated herein by reference.

FIELD

The embodiments discussed herein are related to an electronic device.

BACKGROUND

For an electronic device using radio frequency of large power, it is important to effectively discharge heat radiated from the amplifier, etc.

For this, it is proposed to provide a metal member in an opening formed in the substrate and provide an amplifier, etc. on the metal member, whereby the heat radiated from the amplifier, etc. is effectively discharged.

Related references are as follows:
Japanese Laid-open Patent Publication No. 2003-179181; and
Japanese Laid-open Patent Publication No. Hei 10-242377.

SUMMARY

According to aspects of an embodiment, an electronic device including a first ground conductor layer positioned at an underside of a first insulation layer; a second ground conductor layer positioned at an upper side of the first insulation layer; a second insulation layer positioned at an upper side of the second ground conductor layer; a first connection pattern formed in inside wall of a first opening penetrating the first insulation layer and the second insulation layer and interconnecting the first ground conductor layer and the second ground conductor layer; a conductive member provided in the first opening and connected to the first ground conductor layer; and an electronic element mounted on the member and grounded to the member.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

The proposed electronic device does not always have sufficient reliability, a manufacturing yield, electric characteristics, etc.

[a] First Embodiment

Figure 1A:
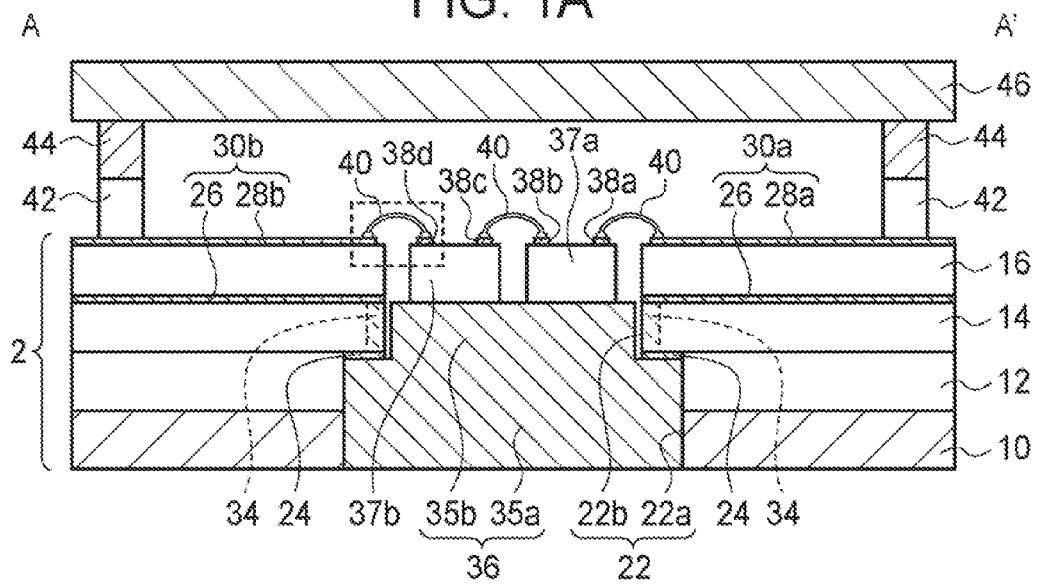
FIG. 1A is a sectional view of an electronic device according to a first embodiment.
Figure 1B:
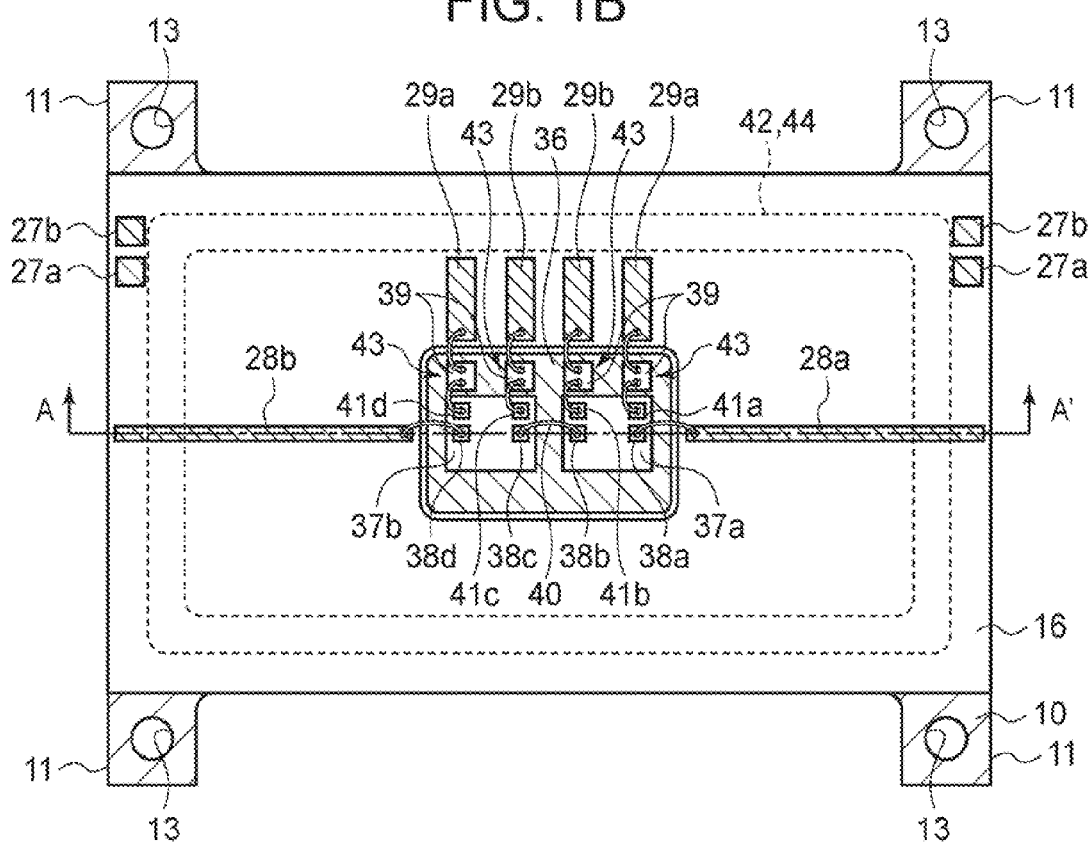
FIG. 1B is a plan view of an electronic device according to the first embodiment.
Figure 2A:
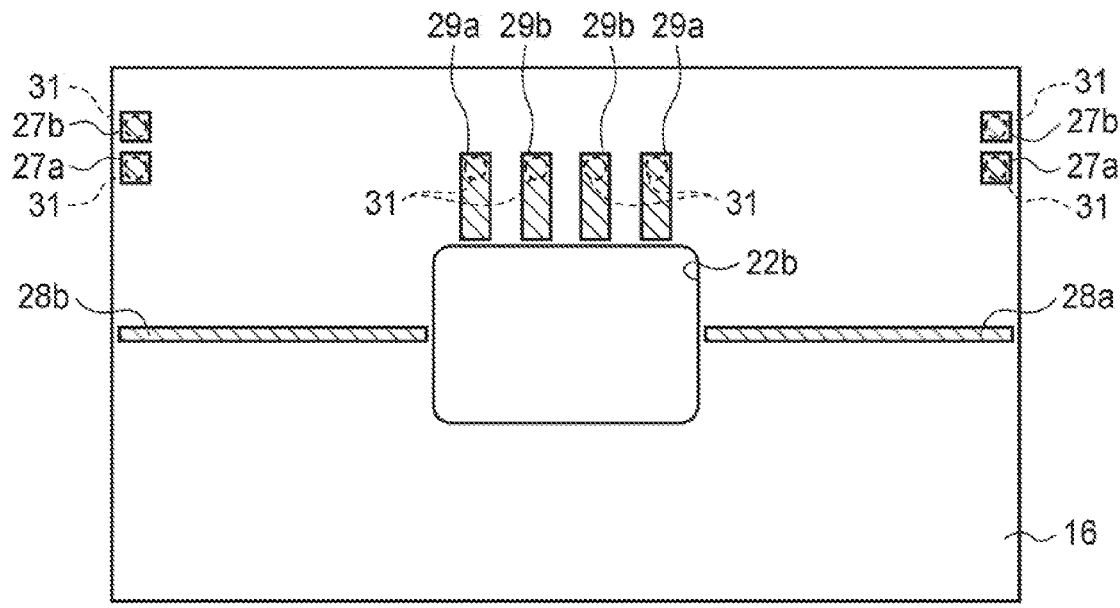
FIGS. 2A to 4B are plan views of respective parts of the electronic device according to the first embodiment.
Figure 2B:
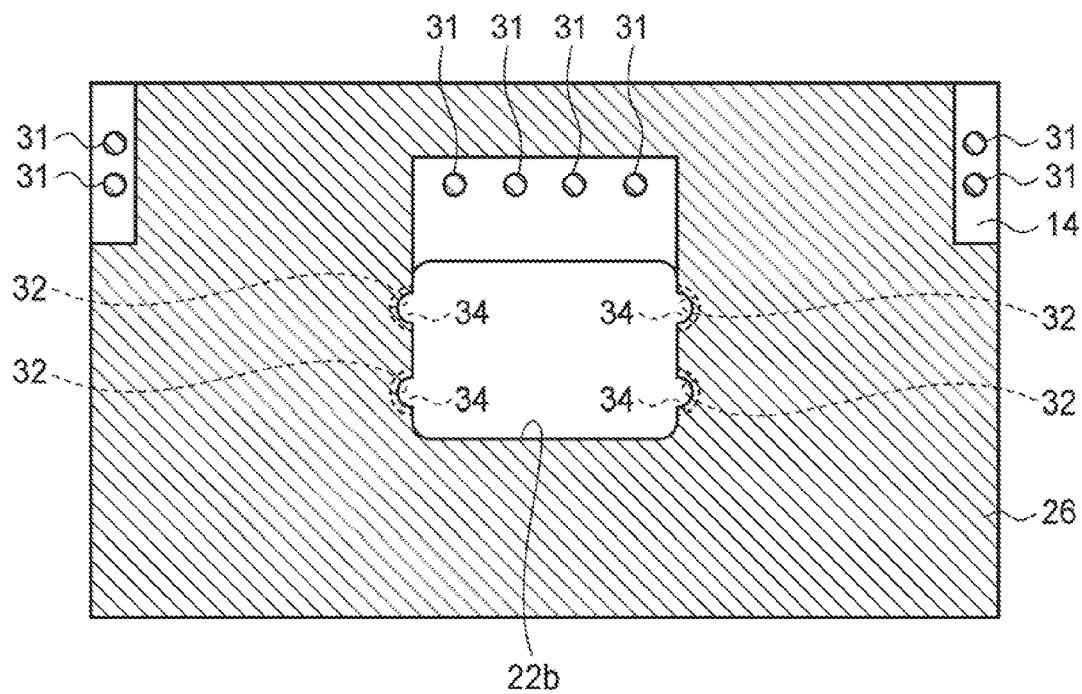
Figure 3A:
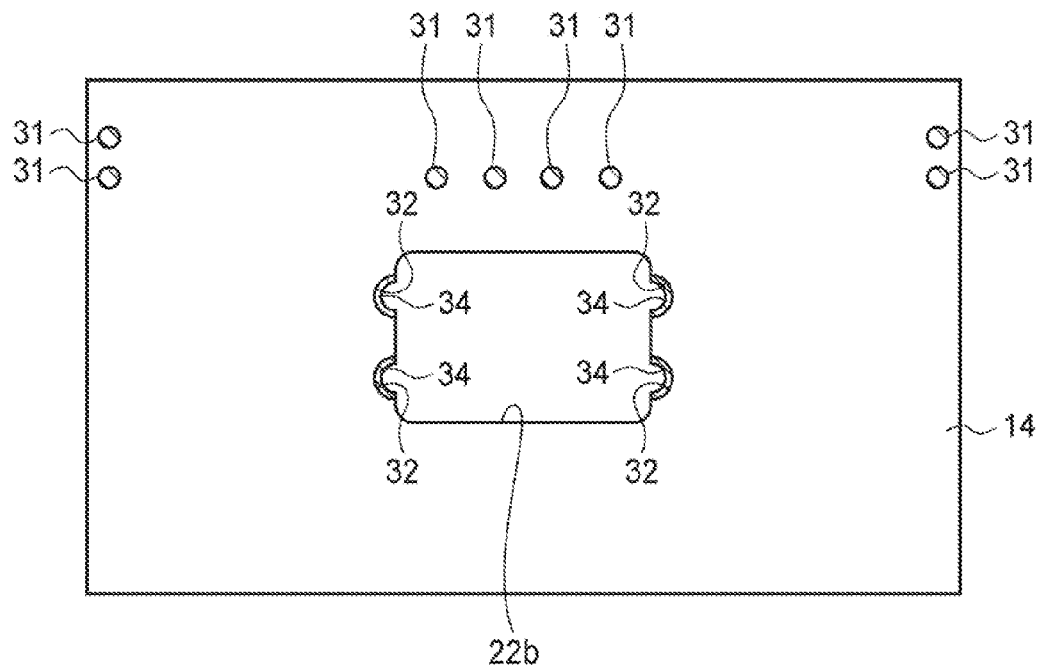
Figure 3B:
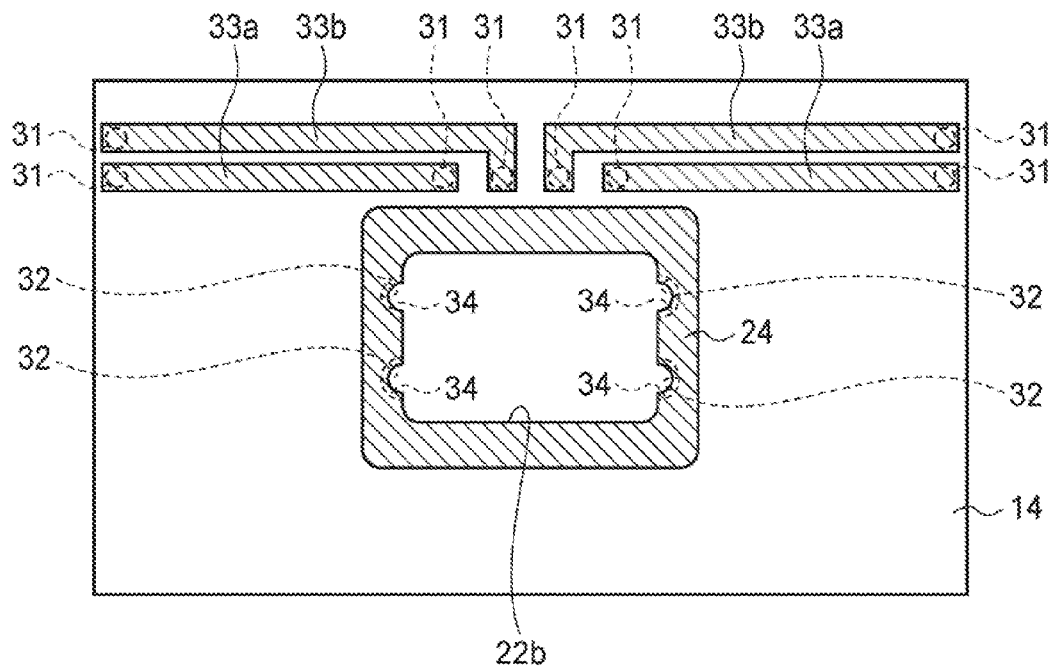
Figure 4A:
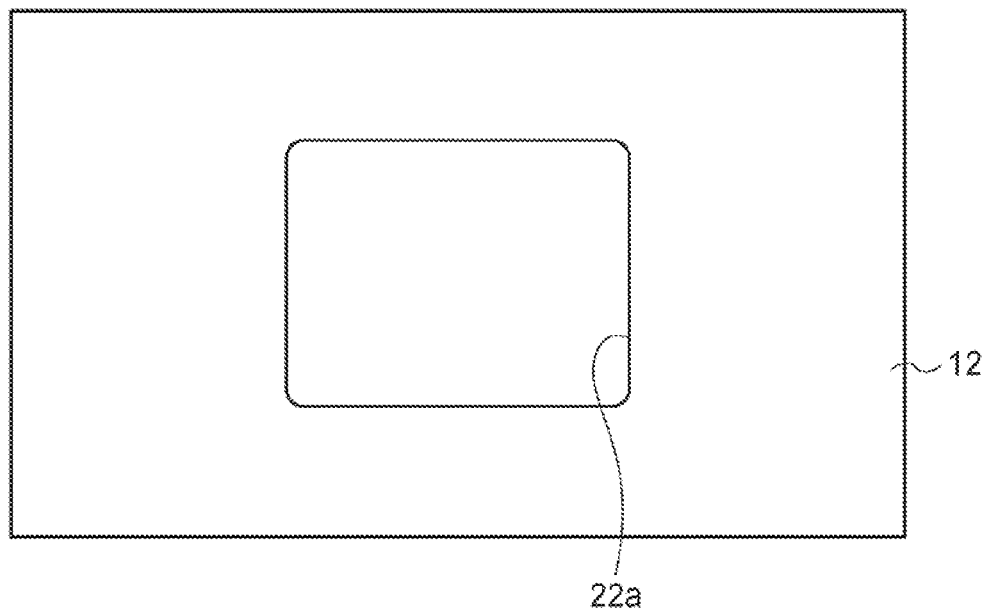
Figure 4B:
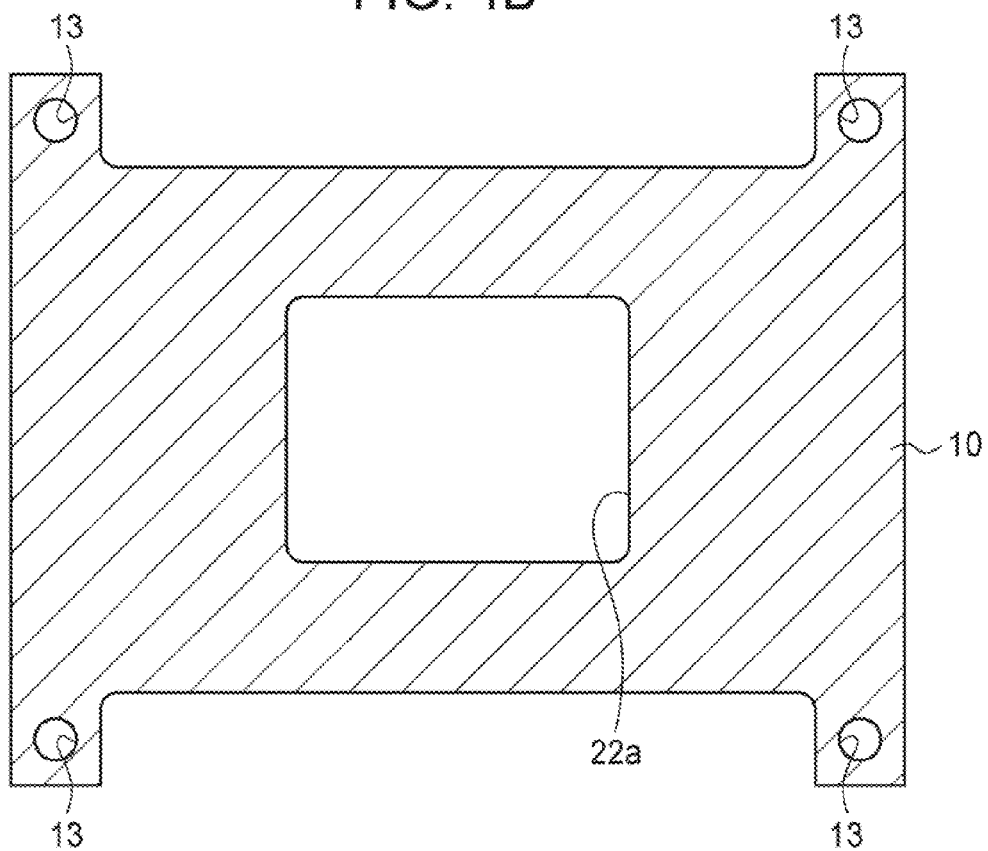
Figure 5A:
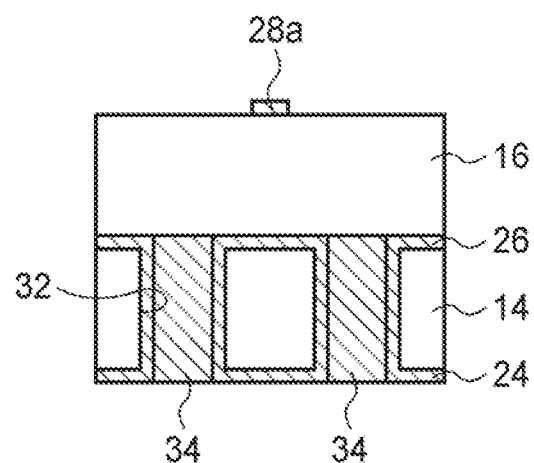
FIGS. 5A and 5B are side views of connection patterns of the electronic device according to the first embodiment.
Figure 5B:
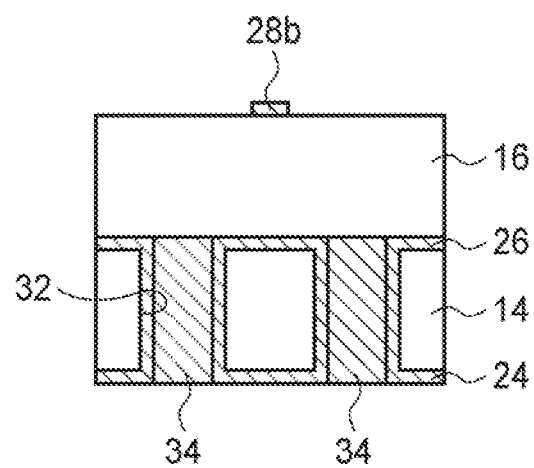
Figure 6A:
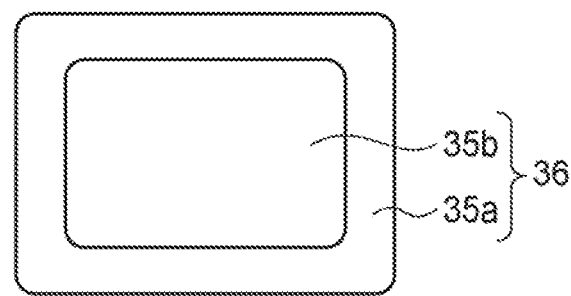
FIG. 6A is a plan view of a member functioning as a ground conductor and a radiator.
Figure 6B:
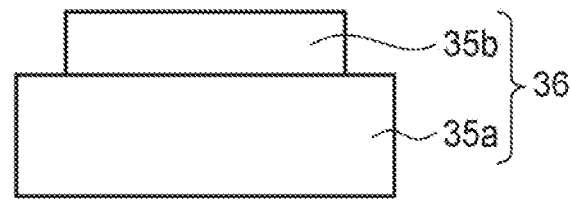
FIG. 6B is a side view of the member functioning as the ground conductor and the radiator.

The electronic device according to a first embodiment will be described with reference to FIGS. 1A to 6B. FIGS. 1A and 1B are a sectional view and a plan view of the electronic device according to the present embodiment. FIG. 1B is a plan view, and FIG. 1A is the A-A' line sectional view of FIG. 1B. FIGS. 2A to 4B are plan views of respective parts of the electronic device according to the present embodiment. FIG. 2A illustrates the pattern of the uppermost insulation film on the upper side. FIG. 2B illustrates the pattern of the uppermost insulation film on the underside. FIG. 3A illustrates the section of the second insulation layer and the connection patterns along the plane parallel with the primary surface of the second insulation layer. FIG. 3B illustrates the patterns of the second insulation layer positioned on the side of the underside. FIG. 4A illustrates the first insulation layer. FIG. 4B illustrates the base. FIGS. 5A and 5B are side views of the connection patterns of the electronic device according to the present embodiment as viewed in the opening. FIGS. 6A and 6B are a plan view and a side view of the member functioning as a ground conductor and a radiator. FIG. 6A is the plan view of the member, and FIG. 6B is the side view of the member.

The electronic device according to the present embodiment is an electronic device for radio frequency (a radio frequency package). The electronic device according to the present embodiment is applied suitably to, e.g., communication, radars, sensors, jamming machines, etc.

The electronic device according to the present embodiment will be described by means of a radio frequency electronic device but is not limited to radio frequency devices. The electronic device according to the present embodiment is applicable to various electronic devices.

As illustrated in FIGS. 1A and 1B, a plurality of insulation layers 12, 14, 16 are formed on a base (a substrate, a support, a supporting substrate) 10. At the four corners of the base 10, securing parts (projected parts) 11 for fixing the base 10 by screws are formed. In the projected parts 11, holes 13 for screwing are formed. The base 10 is fixed to a ground conductor, whereby the base 10 can be connected to the ground potential. As the material of the base 10, a material whose heat conductivity is higher than the plural insulation layers 12, 14, 16 and is conductive is used. More specifically, as the material of the base 10, a metal, for example, is sued. kovar, for example, is used here as the material of the base 10. The thickness of the base 10 is, e.g., about 0.5 mm.

As the material of the insulation layers 12, 14, 16, ceramic, for example, is used. Alumina ceramics, for example, is used here as the material of the insulation layers 12, 14, 16. The thickness of the insulation layers 12, 14, 16 is, e.g., about 0.25 mm.

The multilayer wiring board including insulation layers of alumina ceramics, etc., which requires high-temperature baking, and formed by high-temperature baking is called a high-temperature baked ceramics multilayer substrate, i.e., HTCC (High Temperature Co-fired Ceramics) substrate.

In the substrate 10 and the insulation layers 12, 14, 16, an opening (through-hole) 22 is formed through the substrate 10 and the plural insulation layers 12, 14, 16. That is, the opening 22 penetrates the ceramics multilayer substrate 2 including the substrate 10 and the plural insulation layers 12, 14, 16.

The opening 22 has a partial opening (the first opening) 22a penetrating the substrate 10 and the first insulation layer 12, and a partial opening (the second opening) 22b penetrating the second insulation layer 14 and the third insulation layer 16. The partial opening 22b is positioned over the partial opening 22a, and the partial openings 22a and the partial opening 22b are connected with each other. The diameter (opening dimensions) of the partial opening 22b is set smaller than the diameter (opening dimensions) of the partial opening 22a.

As illustrated in FIGS. 1A and 3B, a ground conductor layer (a ground layer, a ground pattern) 24, and power supply interconnections 33a, 33b are formed on the side of the underside (lower side) of the second insulation layer 14. FIG. 3B is a view of the ground conductor layer 24 and the power supply interconnections 33a, 33b as viewed from below. The underside 24 of the ground conductor layer is exposed in the partial opening 22a. One ends of the power supply interconnections 33a, 33b are positioned near the edge of the insulation layer 14. The other ends of the power supply interconnections 33a, 33b are positioned near the partial opening 22b. As the material of the ground conductor layer 24 and the power supply interconnections 33a, 33b, tungsten, for example, is used.

As illustrated in FIGS. 1A and 2B, on the side of the underside of the third insulation film 16 (the uppermost layer) (therebelow), i.e., on the side of the upper surface of the second insulation layer 14 (thereabove), a ground conductor layer (a ground layer) 26 is formed. The ground conductor layer 26 is formed on the entire surface except the regions for vias 31 positioned. As the material of the ground conductor layer 26, tungsten, for example, is used.

As illustrated in FIGS. 1B and 2A, on the side of the upper surface of the uppermost insulation layer 16 (thereabove), signal patterns (signal lines) 28a, 28b, power terminals 27a, 27b, and power supply interconnections 29a, 29b are formed. As the material of the signal patterns 28a, 28b, the power terminals 27a, 27b and the power supply interconnections 29a, 29b, tungsten plated with, e.g., gold is used. One ends of the signal patterns 28a, 28b are positioned near the opening 22. The other ends of the signal patterns 28a, 28b are positioned near the edge of the insulation layer 16. The power terminals 27a, 27b are positioned near the edge of the insulation layer 16. The power terminals 27a are for applying a gate power source to, e.g., electronic elements 37a, 37b. The power terminals 27b are for applying a drain power source to, e.g., the electronic elements 37a, 37b. The power supply interconnections 29a, 29b are positioned near the partial opening 22b.

The signal patterns 28a, 28b and the ground conductor layer 26 respectively form microstrip lines 30a, 30b.

The power terminals 27a, 27b formed on the side of the upper surface of the uppermost insulation layer 16, and ones ends of the power supply interconnections 33a, 33b formed on the side of the underside of the second insulation layer 14 are electrically connected to each other via vias 31 buried in the second insulation layer 14 and the uppermost insulation layer 16. The other ends of the power supply interconnections 33a, 33b formed on the side of the underside of the second insulation layer 14 and one ends of the power supply interconnections 29a, 29b formed on the side of the upper surface of the uppermost insulation layer 16 are electrically connected to each other via the vias 31 buried in the insulation layers 14, 16.

Thus, the power terminals 27a, 27b formed on the side of the upper surface of the uppermost insulation layer 16, and the power supply interconnections 29a, 29b are electrically connected to each other.

As illustrated in FIGS. 3A, 3B, 5A and 5B, trenches 32 are formed in the inside wall (the side wall) of the opening 22. The longitudinal direction of the trenches 32 is perpendicular to the primary surface of the insulation layer 14. The trenches 32 are formed in the insulation layer 14.

As illustrated in FIGS. 1A, 3A, 5A and 5B, in the trenches 32, connection patterns (castellations, ground interconnections) 34 are formed. The connection patterns 34 connect the ground conductor layer 24 formed on the side of the underside of the second insulation layer 14 and the ground conductor layer 26 formed on the side of the underside of the uppermost insulation layer 16. As the material of the connection pattern 34, tungsten, for example, is used.

In the openings 22, a member (component, stage, block) 36 having a higher heat conductivity than the insulation layers 12, 14, 16, and conductivity is provided. The member 36 functions as the ground conductor and also as a radiator (a heat sink, a heat radiator, a radiator plate, a heat conductor). The member 36 functions as the ground conductor, whereby the ground conductor of electronic elements (electronic parts, semiconductor elements, semiconductor devices) 37a, 37b mounted on the member 36 can be connected to the ground potential via the member 36. The member 36 functions as the radiator, whereby the heat emitted from the electronic elements 37a, 37b can be effectively radiated via the member 36. As the material of the member 36, a metal, for example, is used. As the material of the member 36, CuW (copper tungsten), for example, is used here.

As illustrated in FIGS. 6A and 6B, the member 36 has a part 35a of a relatively large diameter, and a part 35b of a smaller diameter than the part 35a positioned on the part 35a.

The relatively large-diameter part 35*a* is positioned in the partial opening 22*a* of a relatively large diameter. The relatively small-diameter part 35*b* is positioned in the partial opening 22*b* of a relatively small-diameter. The configuration of the section of the member 36 in the direction perpendicular to the primary surface of the base 10 is convex. The upper surface of the relatively large-diameter part 35*a* of the member 36 is connected to the underside of the ground conductor layer 24. The upper surface of the relatively large-diameter part 35*a* of the member 36 and the underside of the ground conductor layer 24 are jointed by, e.g., soldering or others. As the soldering material, for jointing the upper surface of the relatively large-diameter part 35*a* of the member 36 and the underside of the ground conductor layer 24, AuSn or others, for example, is used.

The member 36, which functions as the ground conductor and the radiator, is electrically connected to the ground conductor layer 26 positioned on the side of the underside of the uppermost insulation layer 16 via the connection patterns 34 formed in the inside wall of the opening 22.

Figure 7A:
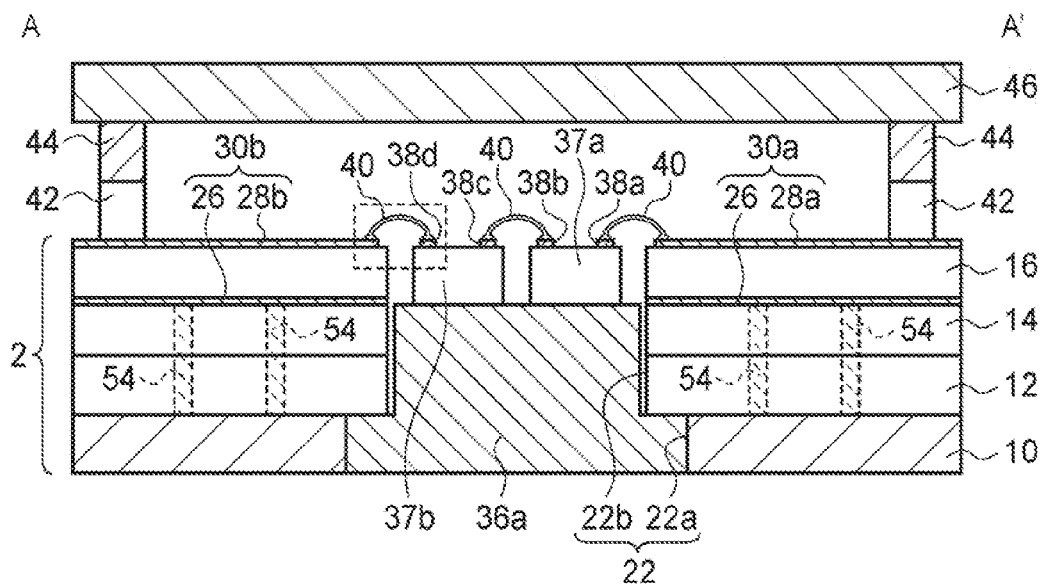
FIG. 7A is a sectional view of an electronic device according to a reference example (Part 1)
Figure 7B:
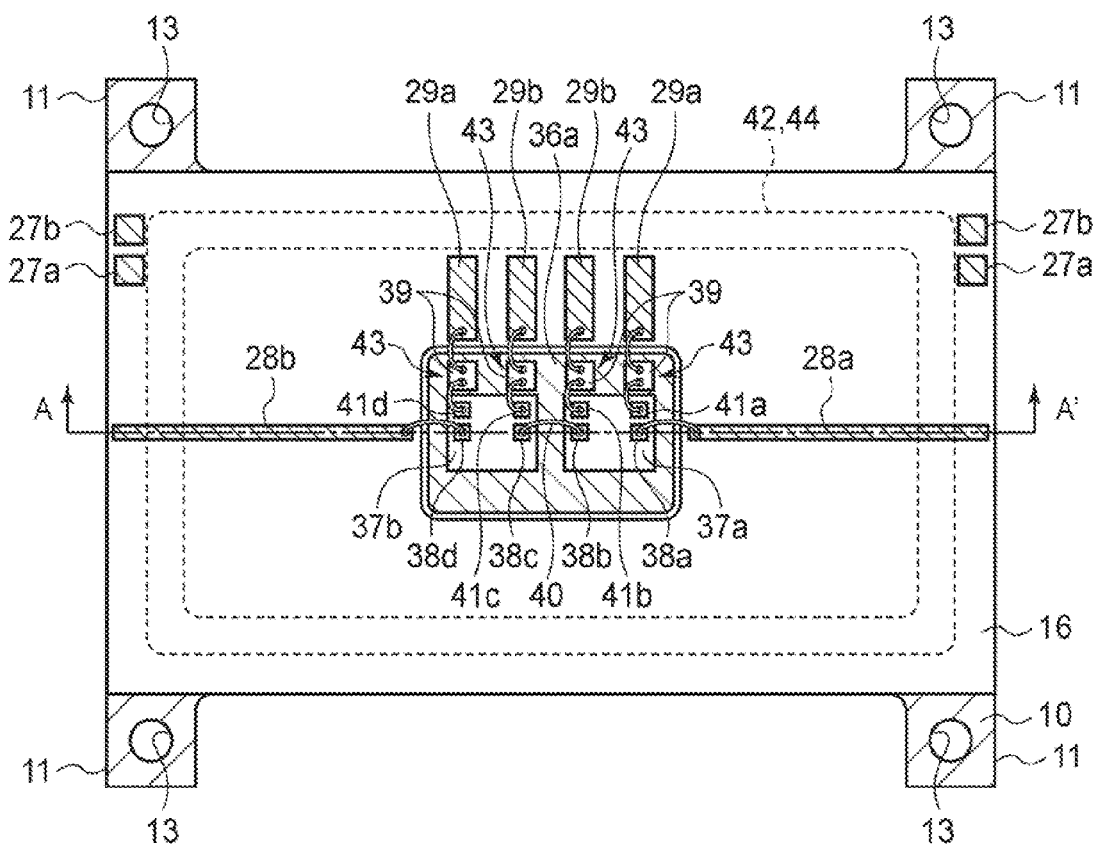
FIG. 7B is a plan view of the electronic device according to the reference example (Part 1)

FIGS. 7A and 7B are a sectional view and a plan view of the electronic device according to a reference example (Part 1). FIG. 7B is the plan view, and FIG. 7A is the A-A' line sectional view of FIG. 7B.

In the electronic device according to the reference example (Part 1), the partial opening 22*a*, whose opening dimensions are relatively large, penetrates the base 10, and the partial opening 22*b*, whose opening dimensions are relatively small, penetrates the insulation layers 12, 14, 16. The member 36*a*, which functions as the ground conductor and the radiator, and the base 10 are connected in the inside wall of the partial opening 22*a* with silver solder or others. The ground semiconductor layer 26 positioned on the side of the underside of the uppermost insulation layer 16 and the base 10 are electrically connected to each other via the vias 54 buried in the insulation layers 12, 14. In such electronic device according to the reference example (Part 1), the electronic elements 37*a*, 37*b* and the ground conductor layer 26 are electrically connected to each other via the member 36*a*, the base 10 and the vias 54. More specifically, the ground conductor (not illustrated) of the electronic elements 37*a*, 37*b* and the ground conductor layer 26 are electrically connected via the member 36*a*, the base 10 and the vias 54. Accordingly, in the electronic device according to the reference example (Part 1), the route of the connection path between the electronic elements 37*a*, 37*b* and the ground conductor layer 26 is relatively long, and the inductance between the electronic elements 37*a*, 37*b* and the ground conductor layer 26 becomes relatively large. In the electronic device according to the reference example (Part 1), wherein the inductance between the electronic elements 37*a*, 37*b* and the ground conductor layer 26 is relatively large, a sufficiently wide bandwidth cannot be always secured, and the transmission loss is relatively large.

Figure 8A:
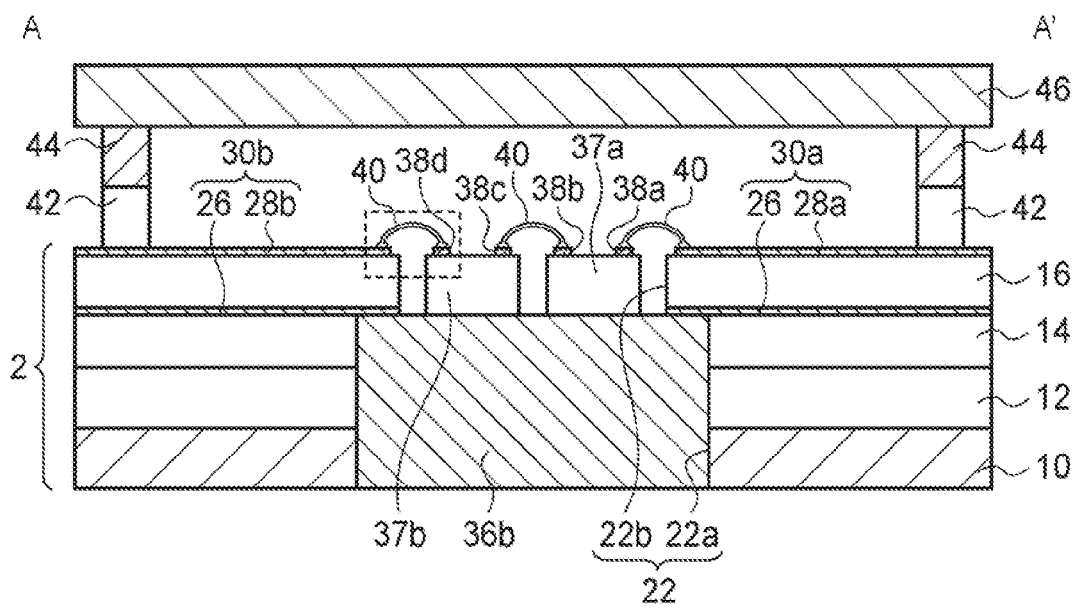
FIG. 8A is a sectional view of an electronic device according to a reference example (Part 2)
Figure 8B:
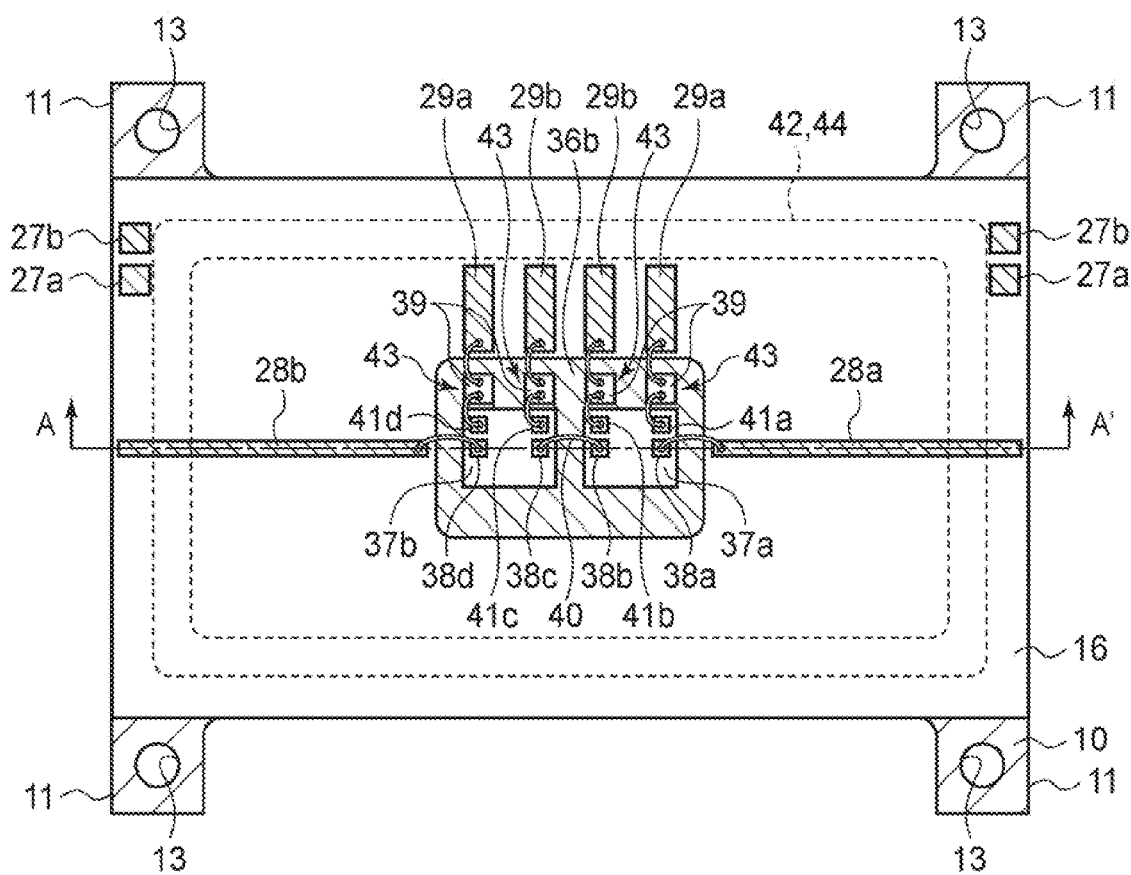
FIG. 8B is a plan view of the electronic device according to the reference example (Part 2)

FIGS. 8A and 8B are a sectional view and a plan view of the electronic device according to a reference example (Part 2). FIG. 8B is the plan view, and the FIG. 8A is the A-A' line sectional view of FIG. 8B.

In the example (Part 2), the partial opening 22*a*, whose opening dimensions are relatively large, penetrates the base 10 and the insulation layers 12, 14, and the partial opening 22*b*, whose opening dimensions are relatively small, penetrates the insulation layer 16. The member 36*b*, which functions as the ground conductor and the radiator, is connected directly to the ground conductor layer 26 positioned on the side of the underside of the uppermost insulation layer 16. The member 36*b*, which functions as the ground conductor and the radiator, and the base 10 are connected to each other in the inside wall of the partial opening 22 with silver solder or others. In the electronic device according to the reference example (Part 2), wherein the member 36*b* and the ground conductor layer 26 are connected directly to each other, the electronic elements 37*a*, 37*b* and the ground conductor layer 26 are connected to each other via the member 36*b*, and the route of the connection path between the electronic elements 37*a*, 37*b* and the ground conductor layer 26 is relatively short.

However, in the electronic device according to the reference example (Part 2), the insulation layer 16 present on the ground conductor layer 26 the member 36*b* abut on is one layer alone. Because of the only one insulation layer 16 present on the ground conductor layer the member 36*b* abut on, the electronic device according to the reference example (Part 2) has a risk that the mechanical strength is not sufficient, and the insulation layer 16 might be broken.

The mechanical strength of the insulation layer can be increased by setting the thickness of the insulation layer 16 large, but in view of the higher frequency, it is not preferable to make the thickness of the insulation layer 16 large. It is required to rather make the thickness of the insulation layer 16 smaller for higher frequency.

Then, in the present embodiment, the ground conductor layer 26 positioned on the side of the underside of the uppermost insulation layer 16 and the ground conductor 24 positioned on the side of the underside of the second insulation layer 14 are connected to each other by the connection patterns 34 formed in the inside wall of the opening 22, and the member 36 are connected to the ground conductor layer 24.

In the present embodiment, to abut the member 36 on the ground conductor layer 24 positioned on the side of the underside of the second insulation layer 14, the plural insulation layers 14, 16 are present on the ground conductor layer 24 the member 36 abut on. Because of presence of the plural insulation layers 14, 16 on the ground conductor layer 24 the member 36 abut on, the electronic device according to the present embodiment can have sufficient mechanical strength, and the insulation layers 14, 16 does not easily break.

Furthermore, in the present embodiment, the member 36 and the ground conductor layer 26 are electrically connected to each other via the connection pattern 34 formed in the inside wall of the opening 22, whereby the route of the connection path between the member 36 and the ground conductor layer 26 is relatively short. Thus, according to the present embodiment, the inductance between the electronic elements 37*a*, 37*b* and the ground conductor layer 26 can be made sufficiently small.

Thus, according to the present embodiment, improvements of electric characteristics, such as increase of the bandwidth, decrease of transmission loss, etc., can be made without impairing reliability, manufacturing yields, etc.

On the member 36, which functions as the ground conductor and radiator, the electronic elements 37*a*, 37*b* and capacitors 43 are arranged. The electronic element 37*a* is, e.g., a preamplifier. The electronic device 37*b* is, e.g., a high output amplifier. The electronic elements 37*a*, 37*b* are secured to the member 36. The ground conductors (not illustrated) of the electronic elements 37*a*, 37*b* are electrically connected to the member 36. More specifically, the ground conductors (not illustrated) of the electronic elements 37*a*, 37*b* are electrically connected to the conductor film (ground conductor) (not illustrated) formed on the side of the underside of the substrate (not illustrated) of the electronic elements 37*a*, 37*b*, and the conductor film is connected to the member 36. The conductor film formed on the side of the underside of the substrate of the electronic elements 37*a*, 37*b*, and the member 36 are jointed with, e.g., soldering or others. As the soldering material for jointing the electronic elements 37a, 37b and the member 36, AuSn or others, for example, is used.

The capacitor 43 includes a lower electrode (not illustrated), a dielectric film (not illustrated) formed on the lower electrode and an upper electrode 39 formed on the dielectric film. The lower electrodes of the capacitors 43 are electrically connected to the member 36. The lower electrodes of the capacitors 43, and the member are jointed by, e.g., soldering or others. As the soldering material for jointing the lower electrodes of the capacitors 43 and the member 36, AuSn or others, for example, is sued.

The member 36 arranged in the opening 22, and the base 10 are jointed with, e.g., silver solder or others. By jointing with silver solder or others, airtightness can be secured, and the member 36 and the base 10 can be electrically connected to each other.

A signal pattern 28a and the signal input terminal 38a of the electronic element 37a are connected to each other by, e.g., a bonding wire (electrical wire) 40. The signal output terminal 38b of the electronic element 37a and the signal input terminal 38c of the electronic element 37b are connected to each other by, e.g., a bonding wire 40. The signal output terminal 38d of the electronic element 37b and a signal pattern 28b are connected to each other by a bonding wire 40.

The other ends of the power supply interconnections 29a, 29b and the upper electrodes of the capacitors 43 are respectively connected to each other by, e.g., bonding wires 40. The upper electrodes 39 of the capacitors 43 and the power supply terminals 41a-41d of the electronic elements 37a, 37b are respectively connected to each other by, e.g., bonding wires 40.

On the uppermost insulation layer 16 with the signal patterns 28a, 28b formed on, a sealing structure enclosing a prescribed region on the uppermost insulation layer 16. The sealing structure 42 is formed in a frame. As the material of the sealing structure 42, an insulative material, for example, is used. An insulative material is used as the material of the sealing structure 42 so as to prevent the short circuit between the sealing structure 42 and the signal patterns 28a, 28b. As the material of the sealing structure 42, alumina ceramics, for example, is used here. The insulative sealing structure 42 is provided on the uppermost insulation layer 16 with the signal patterns 28a, 28b formed on, whereby the feedthrough is formed. That is, input and output of signals can be made in a retained air-tight state.

On the sealing structure 42, a sealing structure 44 is further formed. The sealing structure 44 is formed in a frame as well as the sealing structure 42. As the material of the sealing structure 44, a metal is used. As the material of the sealing structure 44, kovar, for example, is used here. The sealing structure 42 and the sealing structure 44 are secured to each other with silver solder or others.

On the sealing structure 44, a lid 46 for the sealing is provided. The lid 46 is jointed to the sealing structure 44 with, e.g., soldering or others. As the soldering material for jointing the lid 46 and the sealing structure 44 to each other, AuSn solder, for example, is used. The thickness of the lid 46 is, e.g., about 0.3 mm.

Air-tight seal is made by the sealing structures 42, 44 and the lid 46 for the sealing.

Thus, the electronic device according to the present embodiment is constituted.

(Evaluation Result)

Figure 9A:
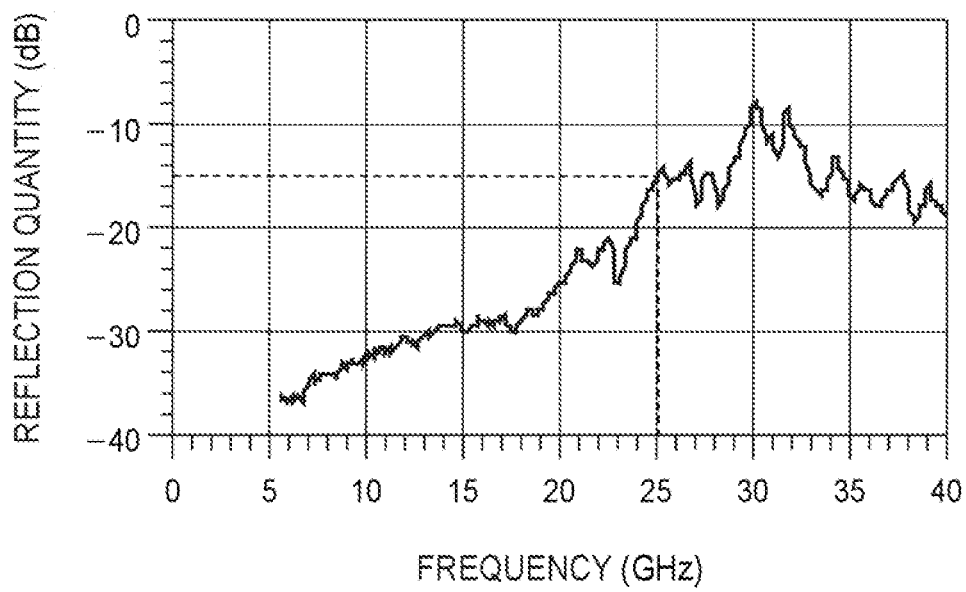
FIGS. 9A and 9B are graphs of results of measuring reflection characteristics.
Figure 9B:
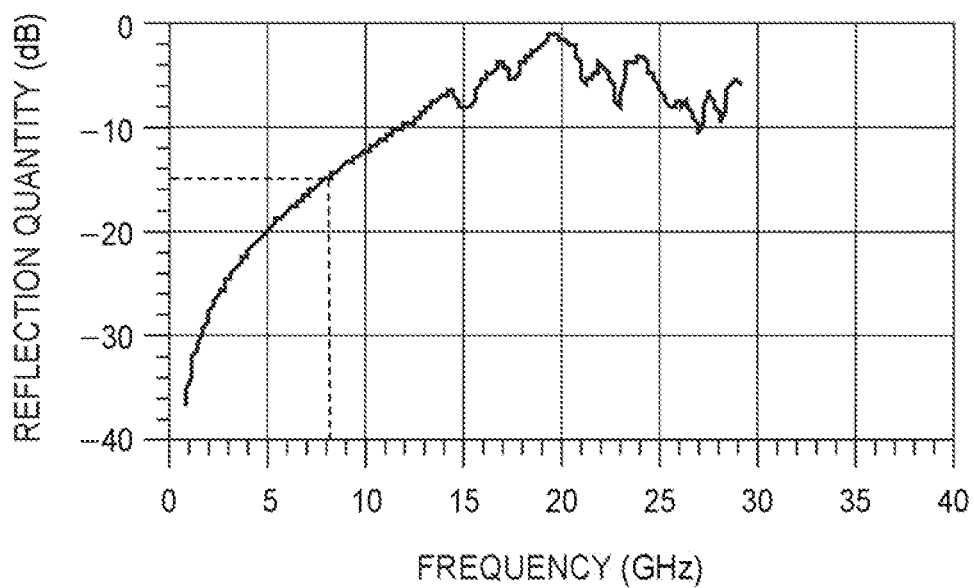

Next, the evaluation result of the electronic device according to the present embodiment will be explained. FIGS. 9A and 9B are graphs of the results of measuring reflection characteristics. In FIGS. 9A and 9B, the frequency is taken on the horizontal axis, and the reflection quantity is taken on the vertical axis. FIG. 9A show the measurement result of the example, i.e., the electronic device according to the present embodiment. FIG. 9B shows the measurement result of a control, i.e., the electronic device of the reference example (Part 1) illustrated in FIGS. 7A and 7B. When the reflection characteristics were measured, the parts enclosed by the broken lines respectively in FIGS. 1A, 1B, 7A and 7B were respectively measured on-waver with an RF probe.

As illustrated in FIGS. 7A and 7B, in the control, i.e., the electronic device of the reference example (Part 1), the connection patterns 34 (see FIGS. 1A and 1B) are not provided in the inside wall of the opening 22. In the control, the member 36a, which functions as the ground conductor and the radiator, and the ground conductor layer 26 are electrically connected to each other via the base 10 and the vias 54.

As shown in FIG. 9B, in the control, the band width where the reflection amount is −15 dB or below was relatively as small as about 8 GHz. The narrow bandwidth of the control will be due to insufficient continuity of the ground of the transmission line.

Contrast to this, as shown in FIG. 9A, the embodiment, i.e., the electronic device according to the present embodiment, the bandwidth where the reflection amount is −15 dB or below was so wide as about 25 GHz. The very wide bandwidth of the embodiment will be due to sufficient continuity of the ground of the transmission line.

Based on this, according to the present embodiment, drastic increase of the bandwidth can be realized.

As described above, according to the present embodiment, the ground conductor layer 24 formed on the side of the underside of the second insulation layer 14 and the ground conductor layer 26 formed on the side of the underside of the uppermost insulation layer 16 are connected to each other by the connection patterns 34 formed in the inside wall of the opening 22. The member 36, which functions as the ground conductor and the radiator, are connected to the underside of the ground conductor layer 24. According to the present embodiment, because of the plural insulation layers 14, 16 present on the ground conductor layer 24 abutting the member 36, sufficient mechanical strength can be obtained, the reliability and the manufacturing yield are not impaired. Besides, because of the connection patterns 34 formed in the opening 22, the route of the connection path between the electronic elements 37a, 37b and the ground conductor layer 26 is relatively short, and the impedance between the electronic elements 37a, 37b and the ground conductor layer 26 is relatively small. Thus, according to the present embodiment, without impairing the reliability and the manufacturing yield, electric characteristics, such as increase of the bandwidth, decrease of the loss, etc., can be improved.

[b] Second Embodiment

Figure 10A:
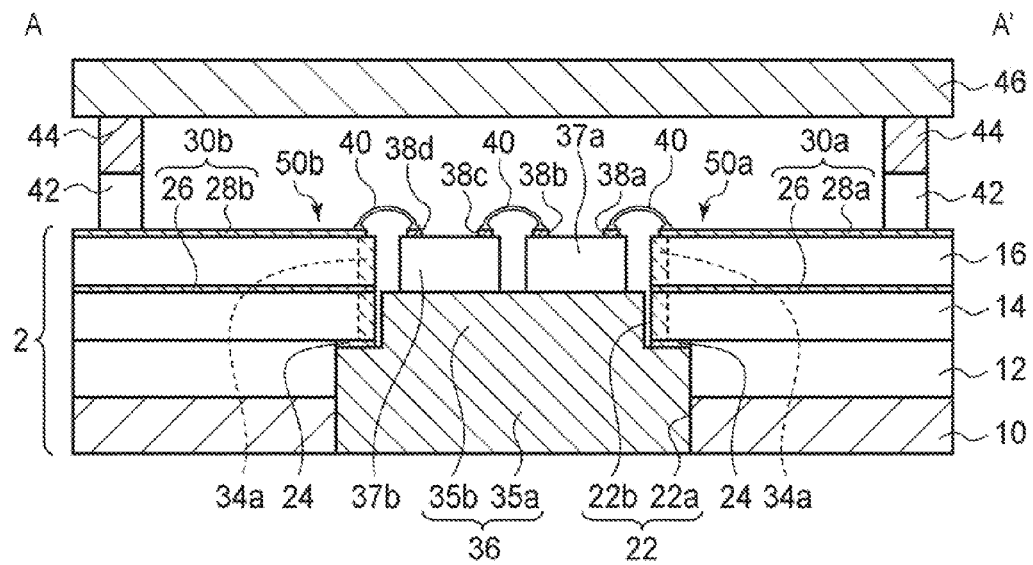
FIG. 10A is a sectional view of an electronic device according to a second embodiment.
Figure 10B:
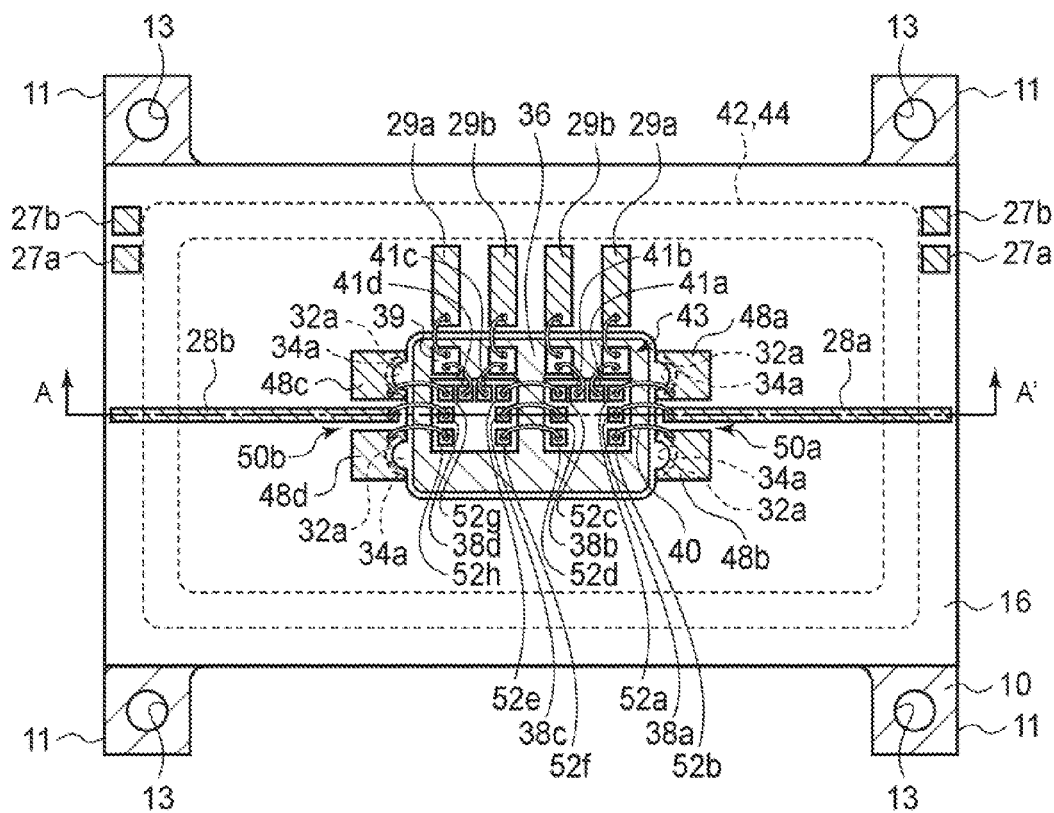
FIG. 10B is a plan view of the electronic device according to the second embodiment.
Figure 11A:
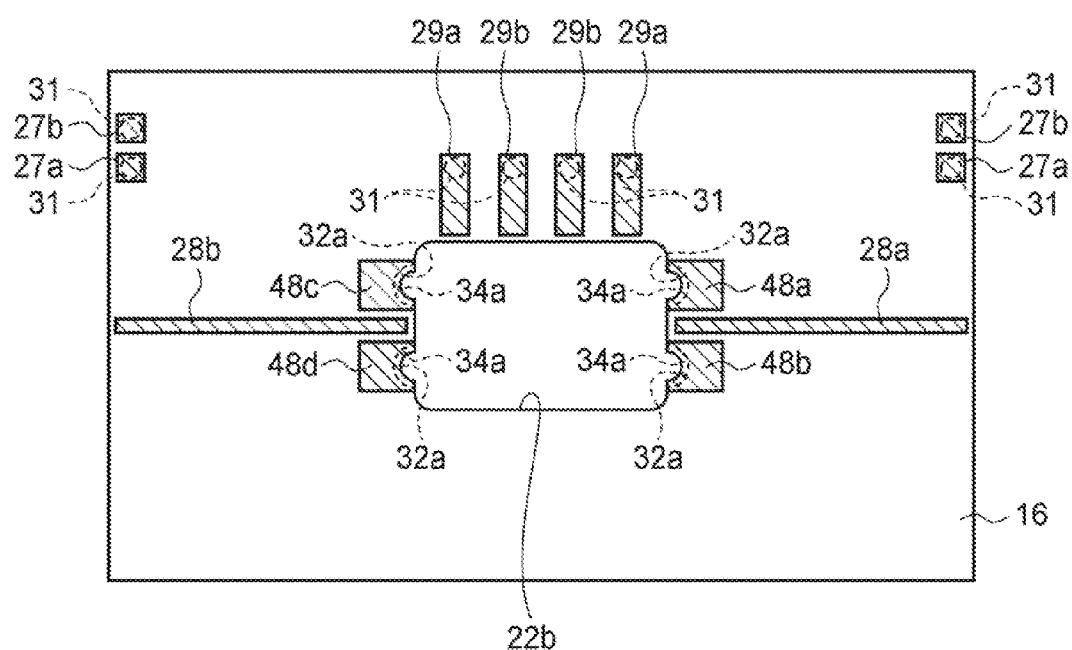
FIGS. 11A to 14 are plan views of respective part of an electronic device according to the second embodiment.
Figure 11B:
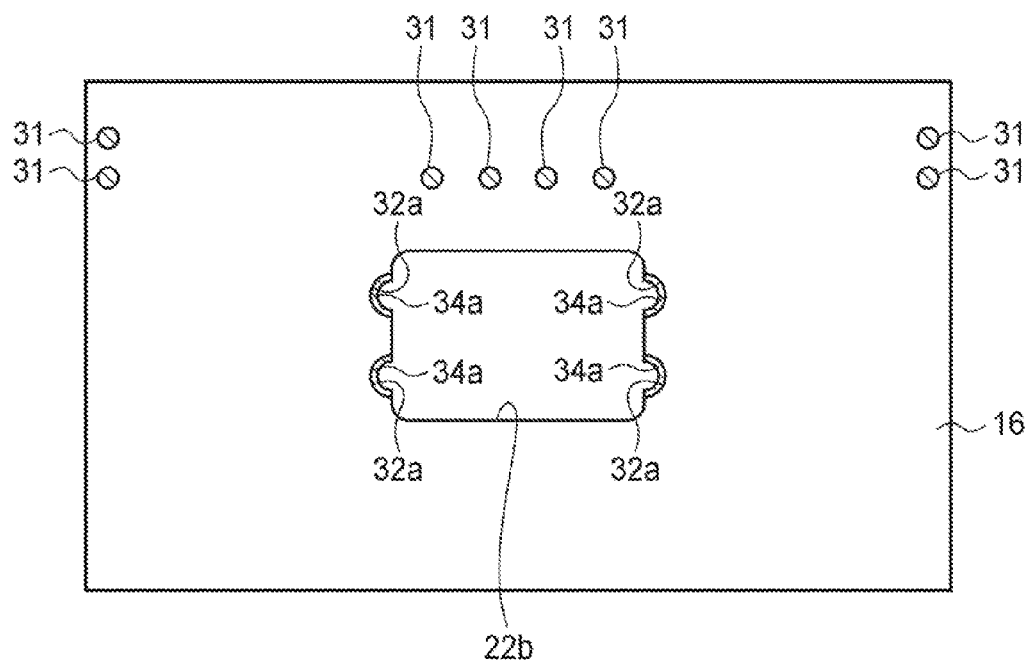
Figure 12A:
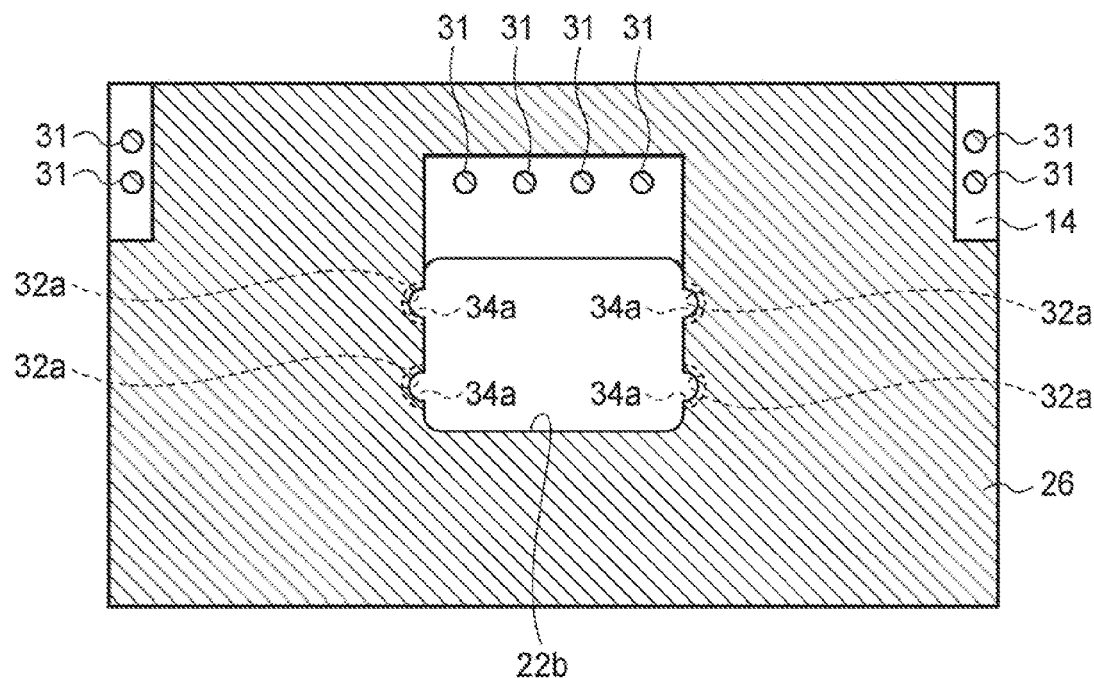
Figure 12B:
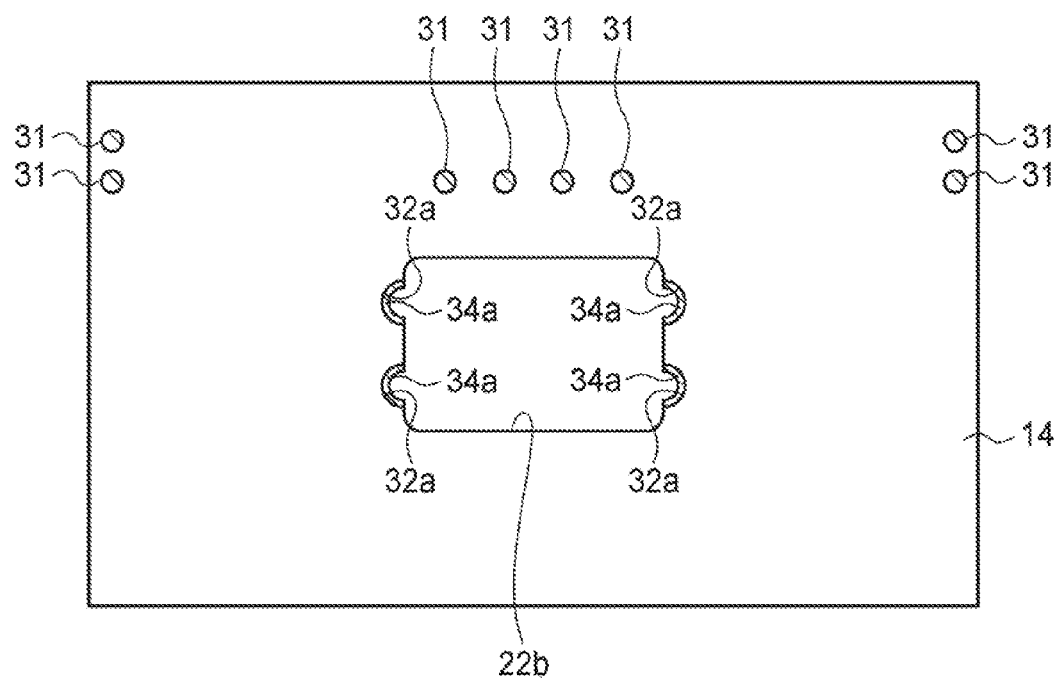
Figure 13A:
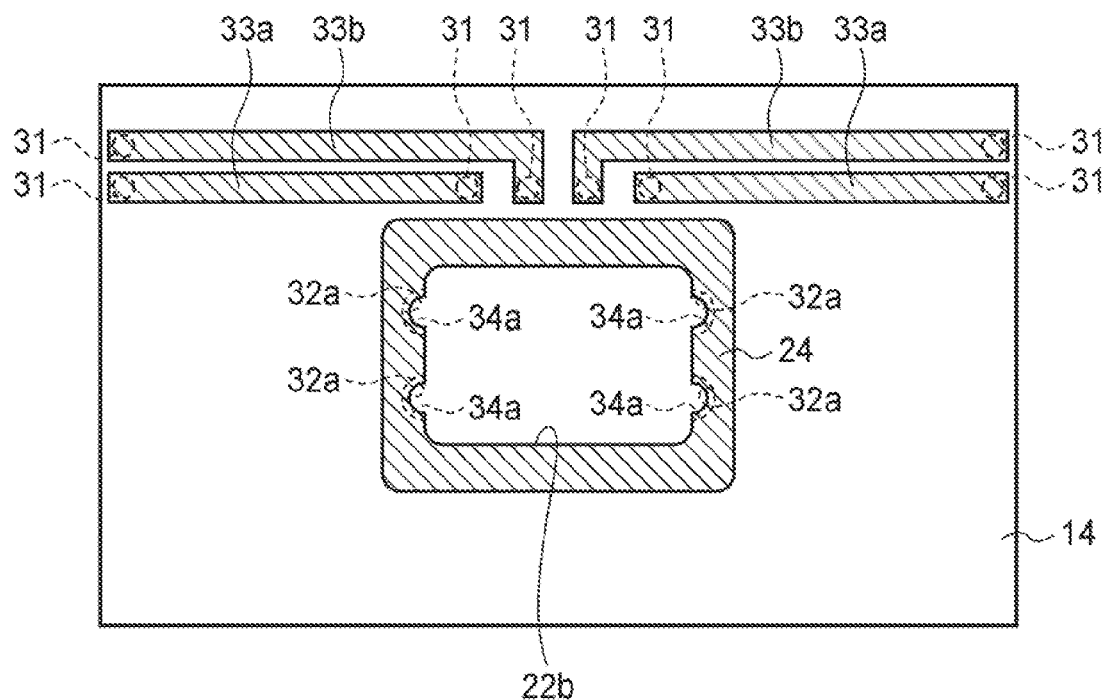
Figure 13B:
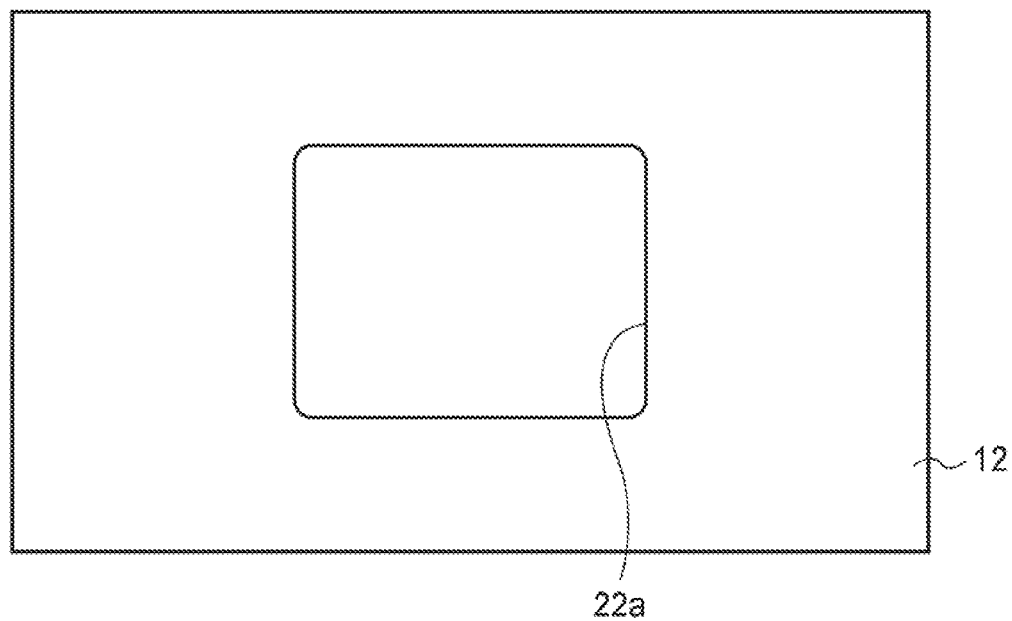
Figure 14:
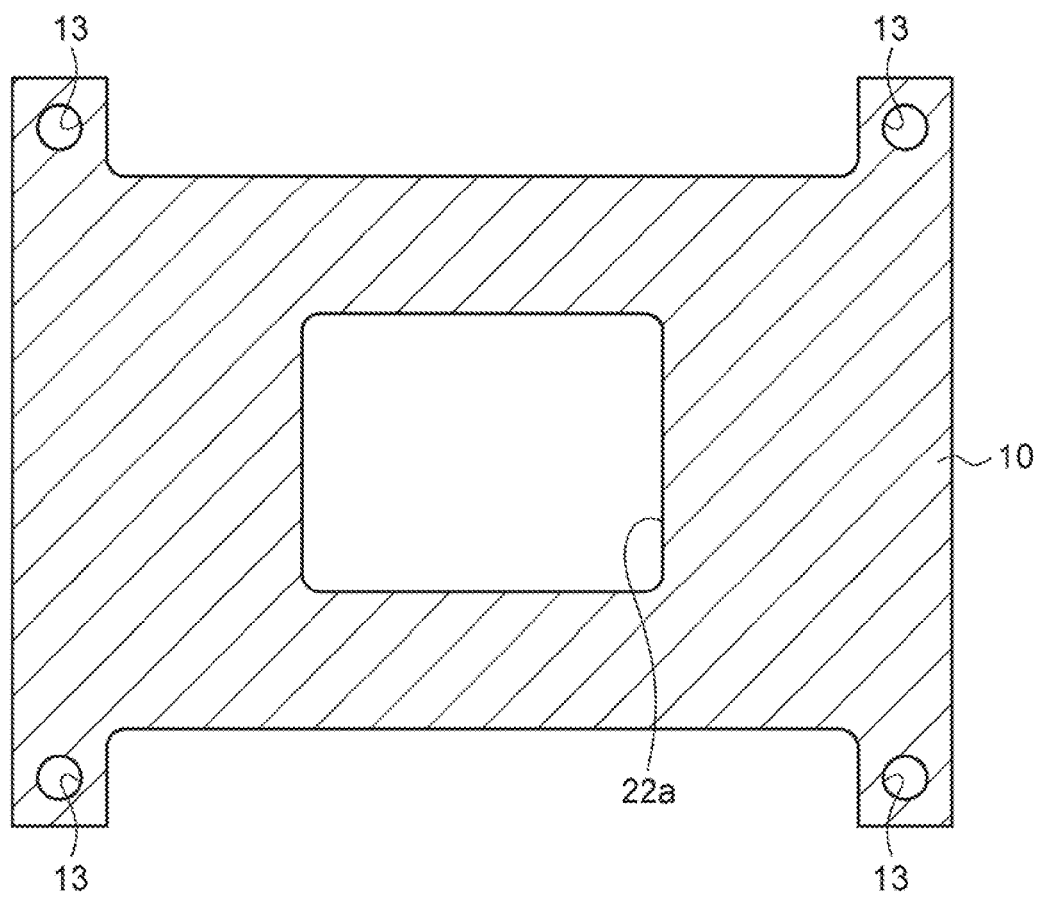
Figure 15A:
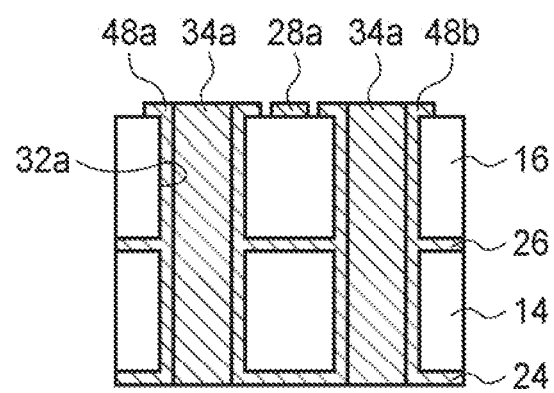
FIGS. 15A and 15B are side views of connection patterns of the electronic device according to the second embodiment.
Figure 15B:
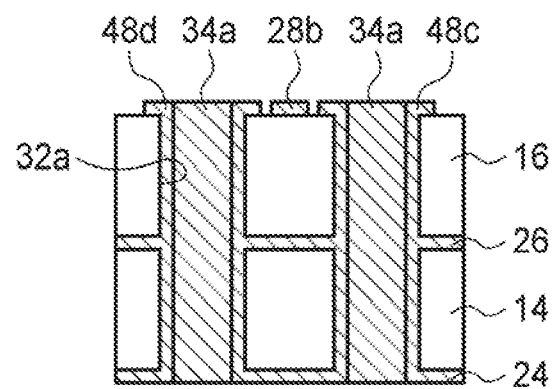

The electronic device according to a second embodiment will be described with reference to FIGS. 10A to 15B. FIGS. 10A and 10B are a sectional view and a plan view of the electronic device according to the present embodiment. FIG. 10B is a plan view, and FIG. 10A is the A-A' line sectional view of FIG. 10B. FIGS. 11A to 14 are plan views of respective part of the electronic device according to the present embodiment. FIG. 11A illustrates the patterns positioned on the side of the upper surface of the uppermost insulation layer. FIG. 11B illustrates the section of the uppermost insulation layer and the connection patterns along the plane parallel with the primary surface of the uppermost insulation layer. FIG. 12A illustrates the patterns positioned on the side of the underside of the uppermost insulation layer. FIG. 12B illustrates the section of the second insulation layer and the connection patterns along the plane parallel with the primary surface of the second insulation layer. FIG. 13A illustrates the patterns positioned on the side of the underside of the second insulation layer. FIG. 13B illustrates the first insulation layer. FIG. 14 illustrates the base. FIGS. 15A and 15B are side views of the connection patterns of the electronic device according to the present embodiment as viewed in the opening. The same constituent members as those of the electronic device according to the first embodiment illustrated in FIGS. 1A to 9B are represented by the same reference numbers not to repeat or to simplify the description.

In the electronic device according to the present embodiment, the ground conductor patterns 48a-48d are formed on the uppermost insulation layer 16, and the connection pattern 34a formed in the inside wall of the opening 22 is connected further to the ground conductor patterns 48a-48d.

As illustrated in FIGS. 10B and 11A, on both sides of the signal pattern 28a, the ground conductor patterns (the ground patterns) 48a, 48b are formed. The ground conductor patterns 48a, 48b are formed along a part of the signal pattern 28a near the opening 22. The ground conductor patterns 48a, 48b are positioned on the side of the upper surface of the uppermost insulation layer 16 (thereabove), as is the signal pattern 28a. The signal pattern 28a and the ground conductor patterns 48a, 48b form a transmission line (a coplanar line) 50a.

On both sides of the signal pattern 28b, the ground conductor patterns 48c, 48d are formed. The ground conductor patterns 48c, 48d are formed along a part of the signal pattern 28b near the opening 22. The ground conductor patterns 48c, 48d are positioned on the side of the upper surface of the uppermost insulation layer 16 (thereabove) as is the signal pattern 28b. The signal pattern 28b and the ground conductor pattern 48c, 48d form a transmission line (the coplanar line) 50b.

One end of the signal pattern 28a and the signal input terminal 38a of the electronic element 37a are connected to each other by, e.g., a bonding wire 40. The ground conductor patterns 48c, 48d and the ground terminals 52a, 52b of the electronic element 37a are respectively connected to each other by, e.g., bonding wires 40.

The signal output terminal 38b of the electronic element 37a and the signal input terminal 38c of the electronic element 37b are connected to each other by, e.g., a bonding wire 40. The ground terminals 52c, 52d of the electronic element 37a and the ground terminals 52e, 52f of the electronic element 37b are respectively connected to each other by, e.g., bonding wires 40.

One end of the signal pattern 28b and the signal output terminal 38d of the electronic element 37b are connected to each other by, e.g., a bonding wire 40. The ground conductor patterns 48c, 48d and the ground terminals 52g, 52h of the electronic element 37b are respectively connected to each other by, e.g., bonding wires 40.

As illustrated in FIGS. 10A to 13B and FIGS. 15A and 15B, in the inside wall of the opening 22, the trenches 32a are formed. The trenches 32a are formed in the insulation layer 14 and the insulation layer 16. The parts of the trenches 32a formed in the insulation layer and the parts of the trenches 32a formed in the insulation layer 16 are connected with each other. The longitudinal direction of the trenches 32a is perpendicular to the primary surfaces of the insulation layers 14, 16. FIG. 13A illustrates the ground conductor layer 24 and the power supply interconnections 33a, 33b as viewed from the underside.

In the trenches 32a, the connection patterns (castellations, ground interconnections) 34a are formed. The connection patterns 34a interconnect the ground conductor layer 26 and the ground conductor layer 24, and are connected respectively to the ground conductor patterns 48a-48d.

Thus, the electronic device according to the present embodiment is constituted.

As described above, it is possible that the ground conductor patterns 48a-48d are formed on the uppermost insulation layer 16, and the connection patterns 34a formed in the inside wall of the opening 22 are connected further to the ground conductor patterns 48a-48d. According to the present embodiment, the ground terminals 52a, 52b, 52g, 52h of the electronic elements 37a, 37b are electrically connected to the ground conductor layer 26, etc. via the ground conductor patterns 48a-48d and the connection patterns 34a, whereby the ground potential of the transmission lines 30a, 30b, 50a, 50b and the ground potentials of the electronic elements 37a, 37b can be mutually stabilized. Thus, according to the present embodiment, electric characteristics, such as increase of the bandwidth, decrease of the loss, etc., can be improved.

[c] Third Embodiment

Figure 16A:
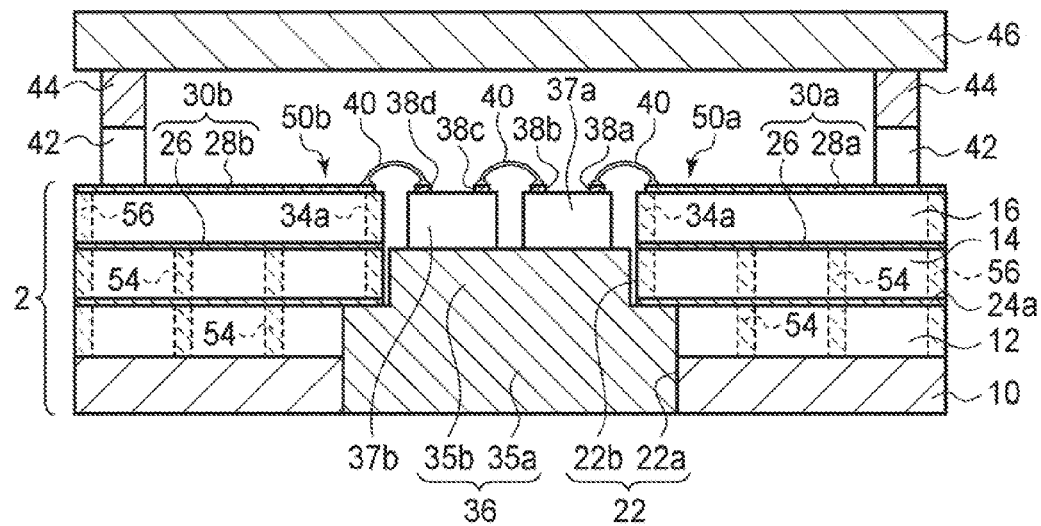
FIG. 16A is a sectional view of an electronic device according to a third embodiment.
Figure 16B:
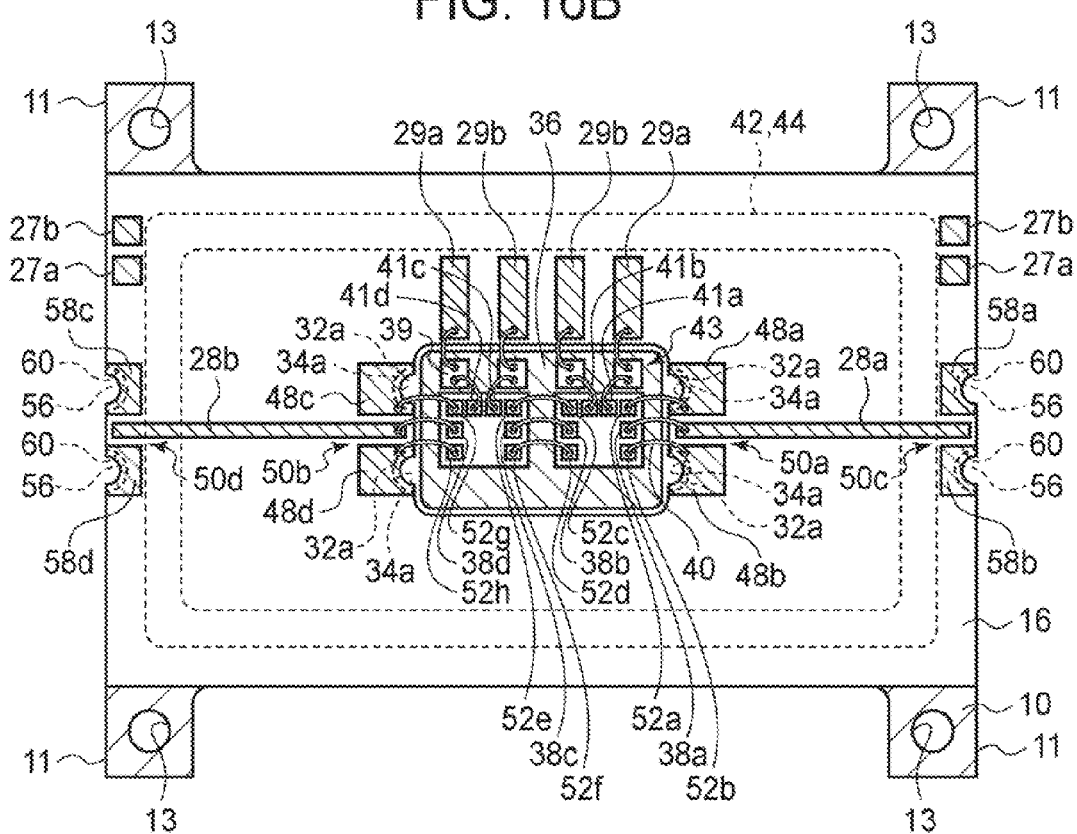
FIG. 16B is a plan view of the electronic device according to the third embodiment.
Figure 17A:
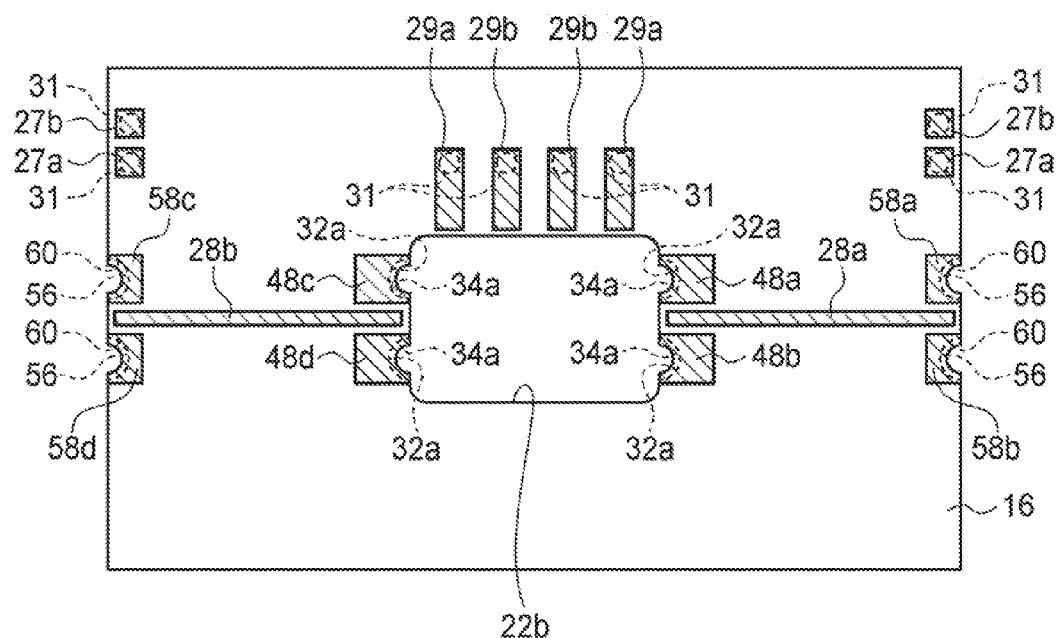
FIGS. 17A to 20 are plan views of respective parts of the electronic device according to the third embodiment.
Figure 17B:
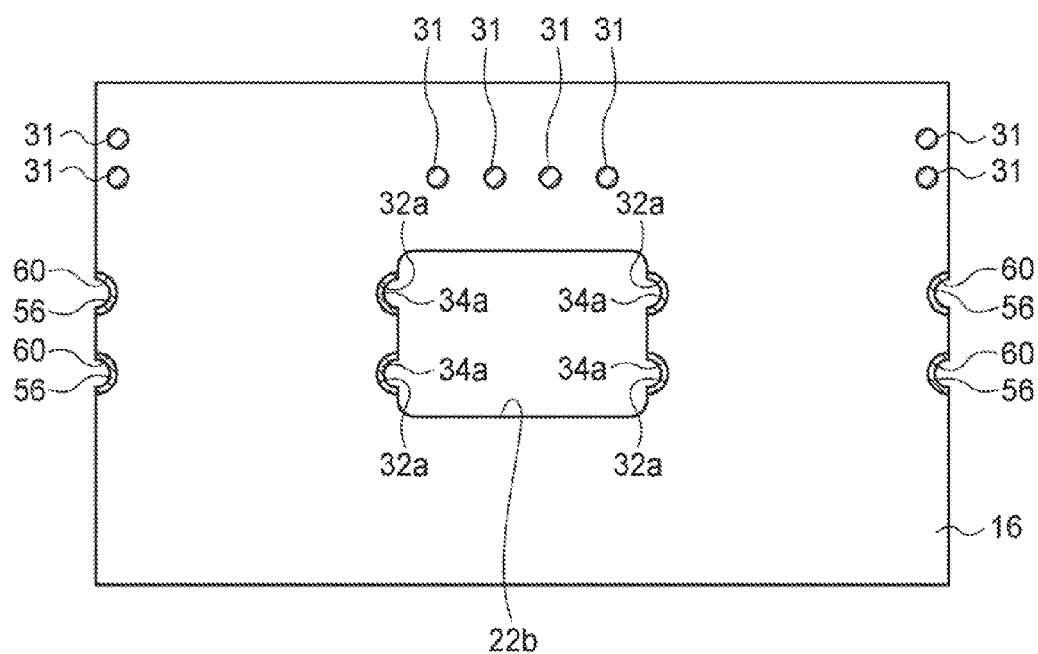
Figure 18A:
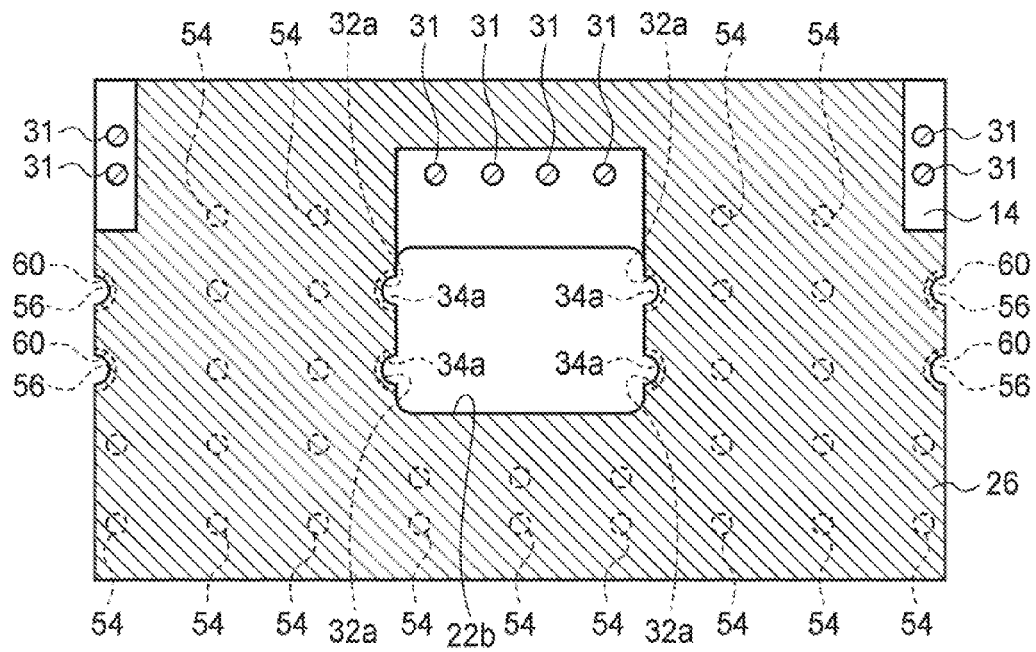
Figure 18B:
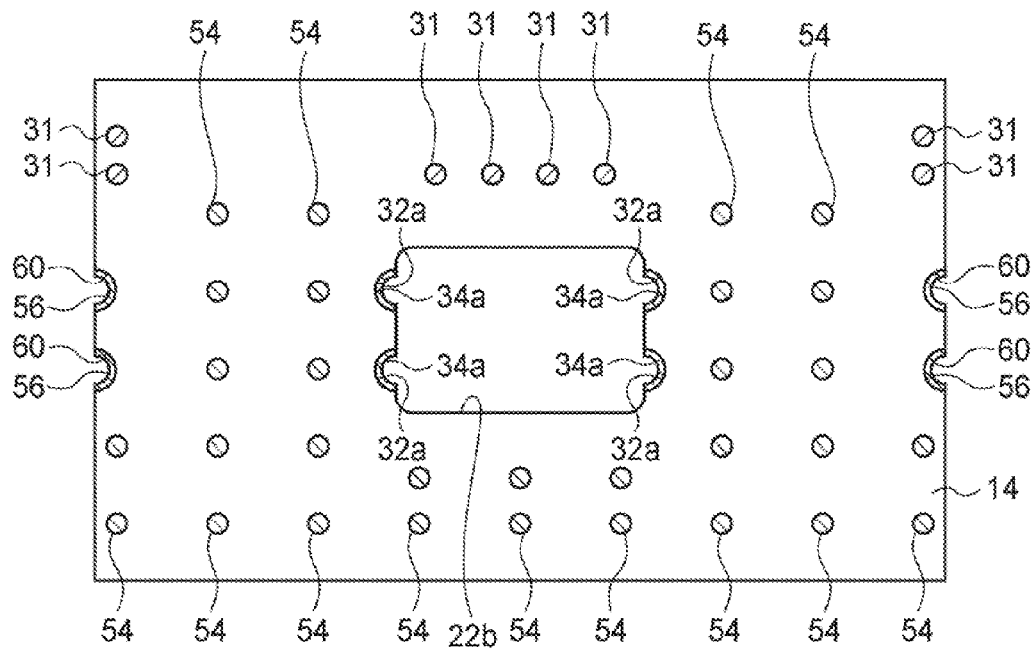
Figure 19A:
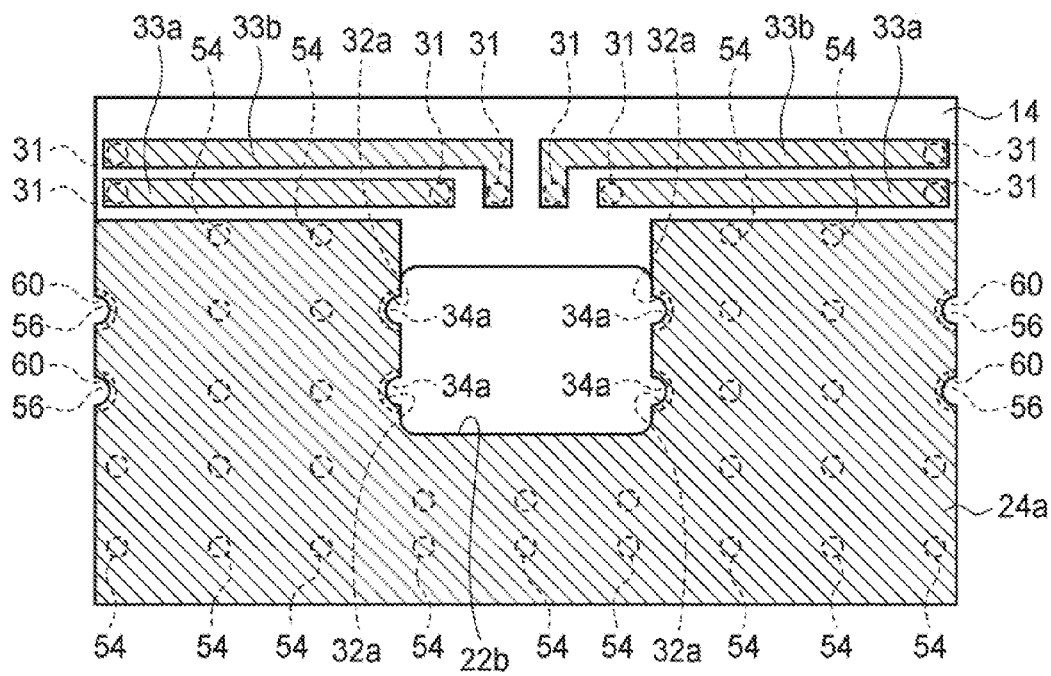
Figure 19B:
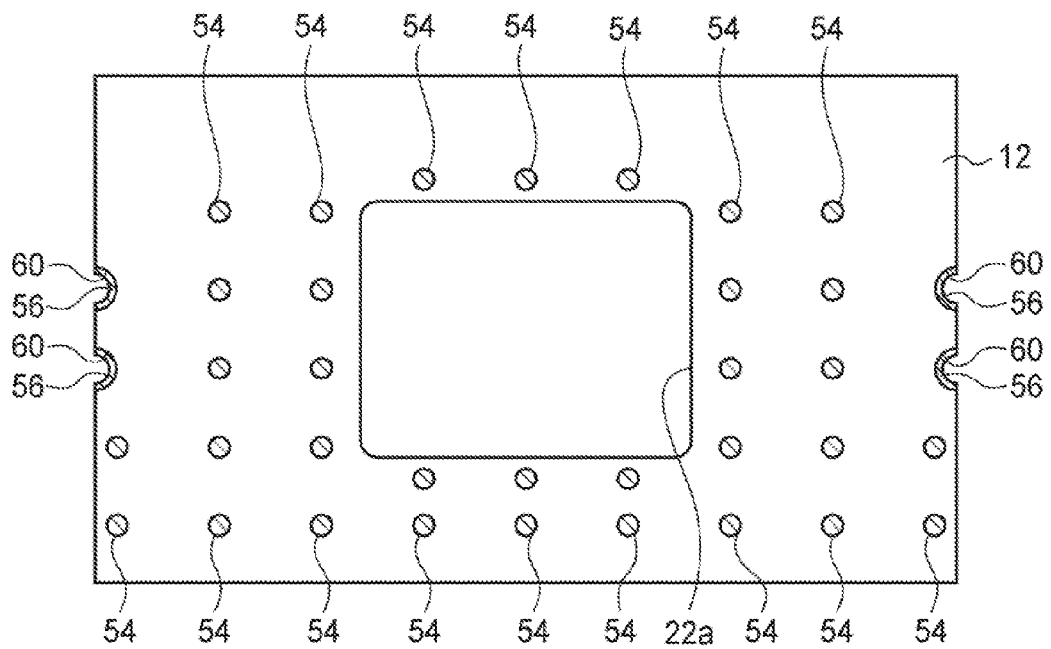
Figure 20:
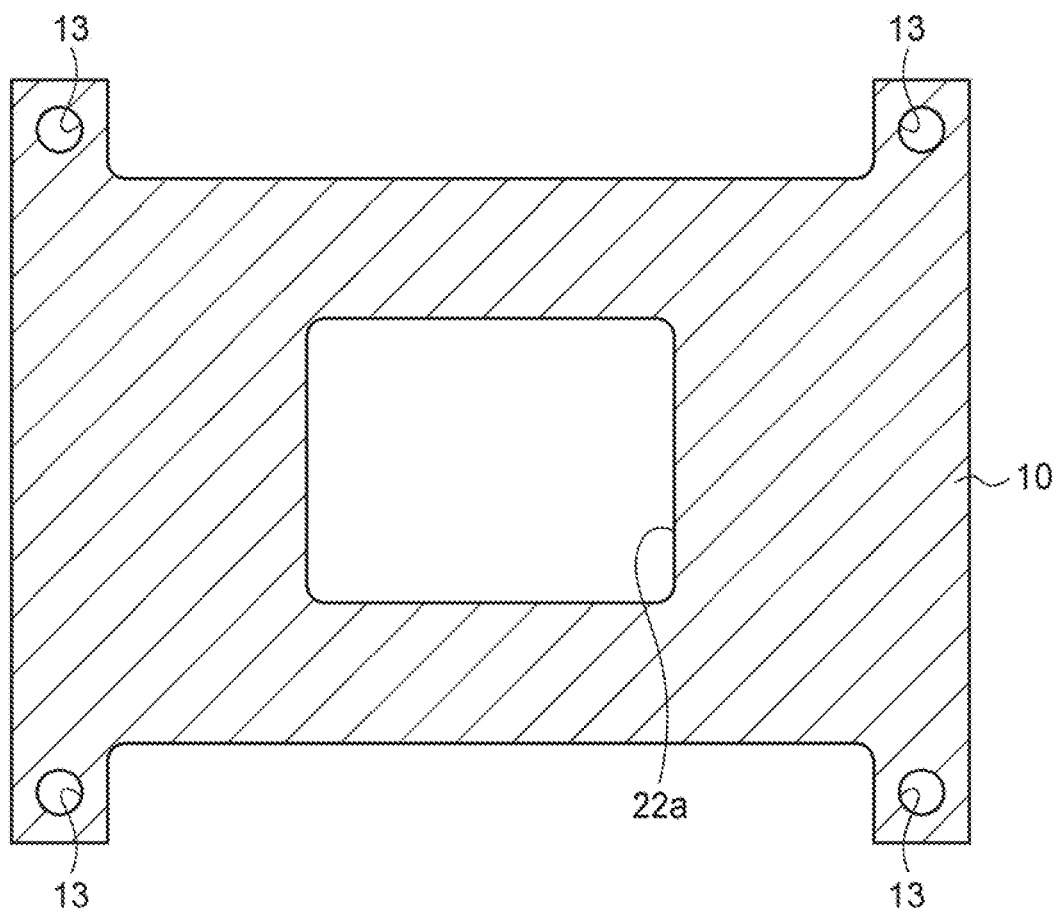
Figure 21A:
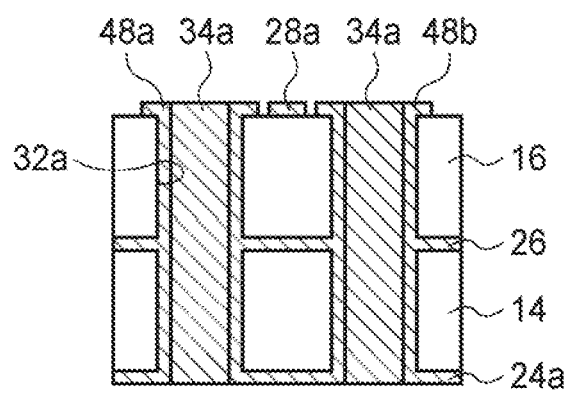
FIGS. 21A to 22B are side views of the connection patterns of the electronic device according to the third embodiment.
Figure 21B:
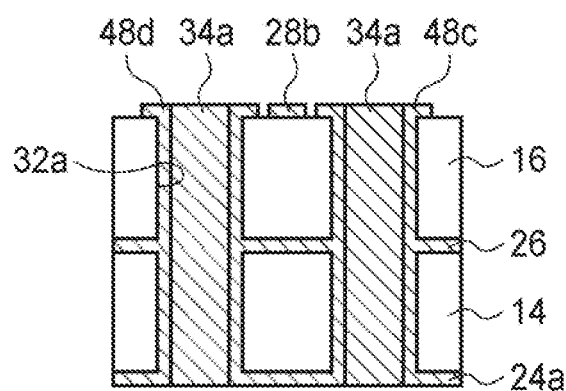
Figure 22A:
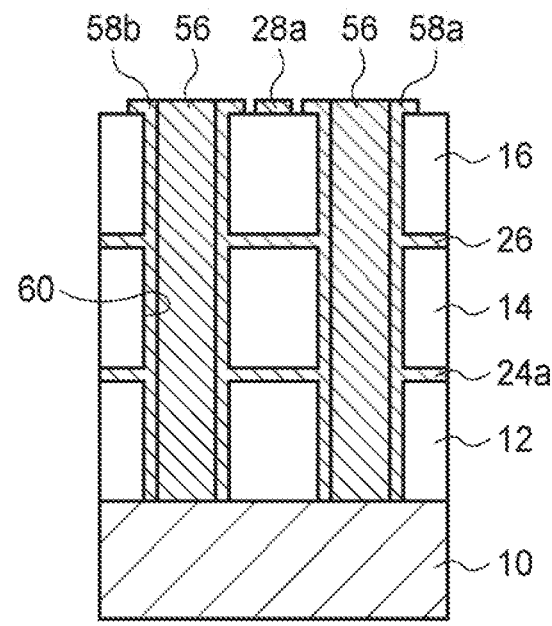
Figure 22B:
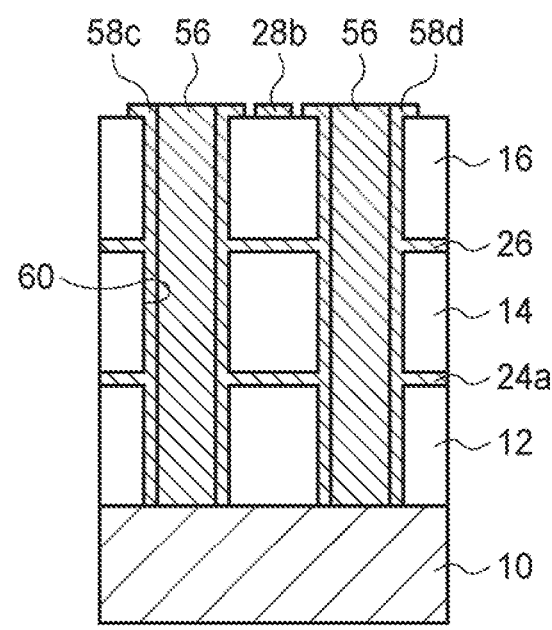

The electronic device according to a third embodiment will be described with reference to FIGS. 16A to 22B. FIGS. 16A and 16B are a sectional view and a plan view of the electronic device according to the present embodiment. FIG. 16B is the plan view, and the FIG. 16A is the A-A' line sectional view of FIG. 16B. FIGS. 17A to 20 are plan views of respective parts of the electronic device according to the present embodiment. FIG. 17A illustrates the patterns positioned on the side of the upper surface of the uppermost insulation layer. FIG. 17B illustrates the section of the uppermost insulation layer and the connection patterns along the plane parallel with the primary surface of the uppermost insulation layer. FIG. 18A illustrates the patterns positioned on the side of the underside of the uppermost insulation layer. FIG. 18B illustrates the section of the second insulation layer and the connection patterns along the plane parallel with the primary surface of the second insulation layer. FIG. 19A illustrates the patterns positioned on the side of the underside of the second insulation layer. FIG. 19B illustrates the section of the first insulation layer and the connection patterns along the plane parallel with the primary surface of the first insulation layer. FIG. 20 illustrates the base. FIGS. 21A and 21B are side views (Part 1) of the connection patterns of the electronic device according to the present embodiment as viewed in the opening. FIGS. 22A and 22B are side views (Part 2) of the connection patterns of the electronic device according to the present embodiment. The same members as those of the electronic device according to the first or the second embodiment illustrated in FIGS. 1A to 15B are represented by the same reference numbers not to repeat or to simplify the description.

In the electronic device according to the present embodiment, the ground conductor patterns 58a-58d are formed near the edge of the insulation layer 16, and the ground conductor patterns 58a-58d are connected to the ground conductor layer 26, etc. by the connection patterns 56 formed in the side walls of the edges of the insulation layers 12, 14, 16. In the electronic device according to the present embodiment, the ground conductor layer 26 positioned on the side of the underside of the uppermost insulation layer 16 and the ground conductor layer 24a positioned on the side of the underside of the second insulation layer 14 are connected further to the base 10 via the vias 54.

As illustrated in FIG. 19A, on the side of the underside of the second insulation layer 14 (therebelow), the ground conductor layer 24a and the power supply interconnections 33a, 33b are formed. The ground conductor layer 24a is formed in the entire region except the region where the power supply interconnections 33a, 33b are provided. FIG. 19A is the view of the ground conductor layer 24a and the power supply interconnections 33a, 33b as viewed from the underside.

As illustrated in FIGS. 18B and 19B, a plurality of the vias 54 are formed in the insulation layer 12 and the insulation layer 14. The ground conductor layer 26 positioned on the side of the underside of the uppermost insulation layer 16 and the ground conductor layer 24a positioned on the side of the underside of the second insulation layer 14 are connected to the base 10 via vias 54.

As illustrated in FIGS. 16A to 19B and FIGS. 21A and 21B, as in the electronic device according to the second embodiment, the connection patterns 34a are formed in the inside wall of the opening 22. That is, the inside wall of the opening 22, the trenches 32a are formed. The trenches 32a are formed in the fourth insulation layer 14 and the fifth insulation layer 16. The parts of the trenches 32a formed in the insulation layer 14 and the parts of the trenches 32a formed in the insulation layer are connected with each other. The longitudinal direction of the trenches 32a is perpendicular to the primary surfaces of the insulation layers 14, 16. In the trenches 32a, the connection patterns (castellations, the ground interconnections) 34a are formed. The connection patterns 34a connect the ground conductor layer 26 and the ground conductor layer 24a and are respectively connected to the ground conductor patterns 48a-48d.

As illustrated in FIGS. 16A and 16B, on both sides of the signal pattern 28a, the ground conductor patterns 58a, 58b are formed. The ground conductor patterns 58a, 58b are for connecting the outside ground lines. The ground conductor patterns 58a, 58b are formed along a part of the signal pattern 28a near the edges (the outer edges) of the insulation layers 12, 14, 16. The ground conductor patterns 58a, 58b are positioned on the side of the upper surface of the uppermost insulation layer 16 (thereabove), as is the signal pattern 28a. The signal pattern 28a and the ground conductor patterns 48a, 48b form the transmission line (the coplanar line) 50c.

On both sides of the signal pattern 28b, the ground conductor patterns 58c, 58d are formed. The ground conductor patterns 58c, 58d are for connecting the outside ground lines. The ground conductor patterns 58c, 58d are formed along a part of the signal pattern 28b near the edges of the insulation layers 12, 14, 16. The ground conductor patterns 58c, 58d are positioned on the side of the upper surface of the uppermost insulation layer 16 (thereabove), as is the signal pattern 28b. The signal pattern 28b and the ground conductor patterns 48c, 48d form the transmission line (the coplanar line) 50d.

As illustrated in FIGS. 16A to 19B and FIGS. 22A and 22B, in the edges of the insulation layers 12, 14, 16, trenches 60 are formed in the edges of the insulation layers 12, 14, 16. The longitudinal direction of the trenches 60 is perpendicular to the primary surfaces of the insulation layers 12, 14, 16. The trenches 60 are formed in the insulation layer 12, the insulation layer 14 and the insulation layer 16. The parts of the trenches formed in the insulation layer 12, the parts of the trenches 60 formed in the insulation layer 14 and the parts of the trenches 60 formed in the insulation layer 16 are connected with each other. In the trenches 60, connection patterns (castellations) 56 are formed. The connection patterns 56 respectively connect the ground conductor patterns 58a-58d, the ground conductor layer 26 and the ground conductor layer 24a, and the base 10.

Thus, the electronic device according to the present embodiment is formed.

As described above, according to the present embodiment, the ground conductor patterns 58a-58d are formed on the insulation layer 16 near the edge of the insulation layer 16. The ground conductor patterns 58a-58d are connected to the ground conductor layer 26, etc. by the connection patterns 56 formed in the side walls of the edge of the insulation layers 12, 14, 16. Thus, according to the present embodiment, the outside ground line (not illustrated) can be electrically connected to the ground conductor layer 26, etc. without leading the connection path long, Consequently, electric characteristics, such as increase of the bandwidth, decrease of the loss, etc., can be further improved.

In the electronic device according to the present embodiment, the ground conductor layer 26 positioned on the side of the underside of the uppermost insulation layer 16 and the ground conductor layer 24a positioned on the side of the underside of the second insulation layer 14 are connected to the base 10 via the vias 54. Thus, according to the present embodiment, the potential of the ground conductor layer 26, etc. can be stabilized, and electric characteristics, such as increase of the bandwidth, decrease of the loss, etc., can be further improved.

[d] Fourth Embodiment

Figure 23:
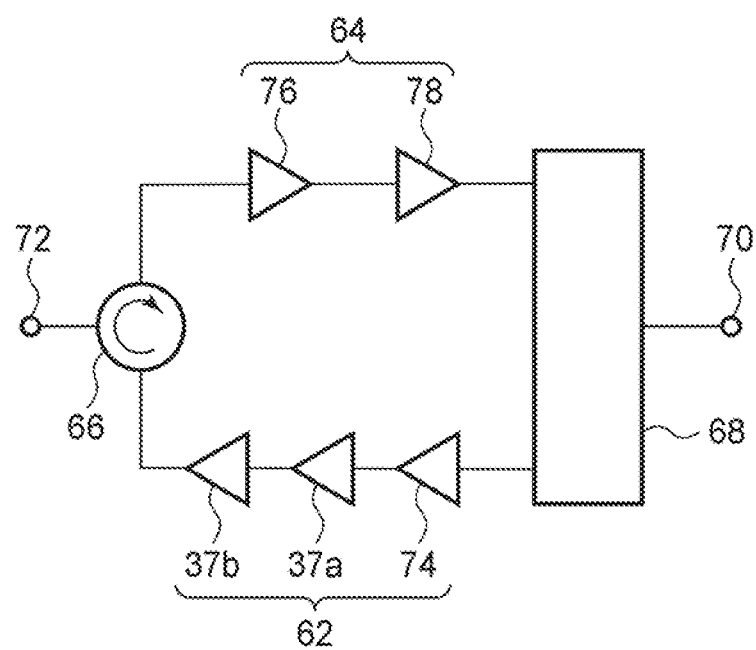
FIG. 23 is a block diagram of the circuit structure of an electronic device according to a fourth embodiment.
Figure 24:
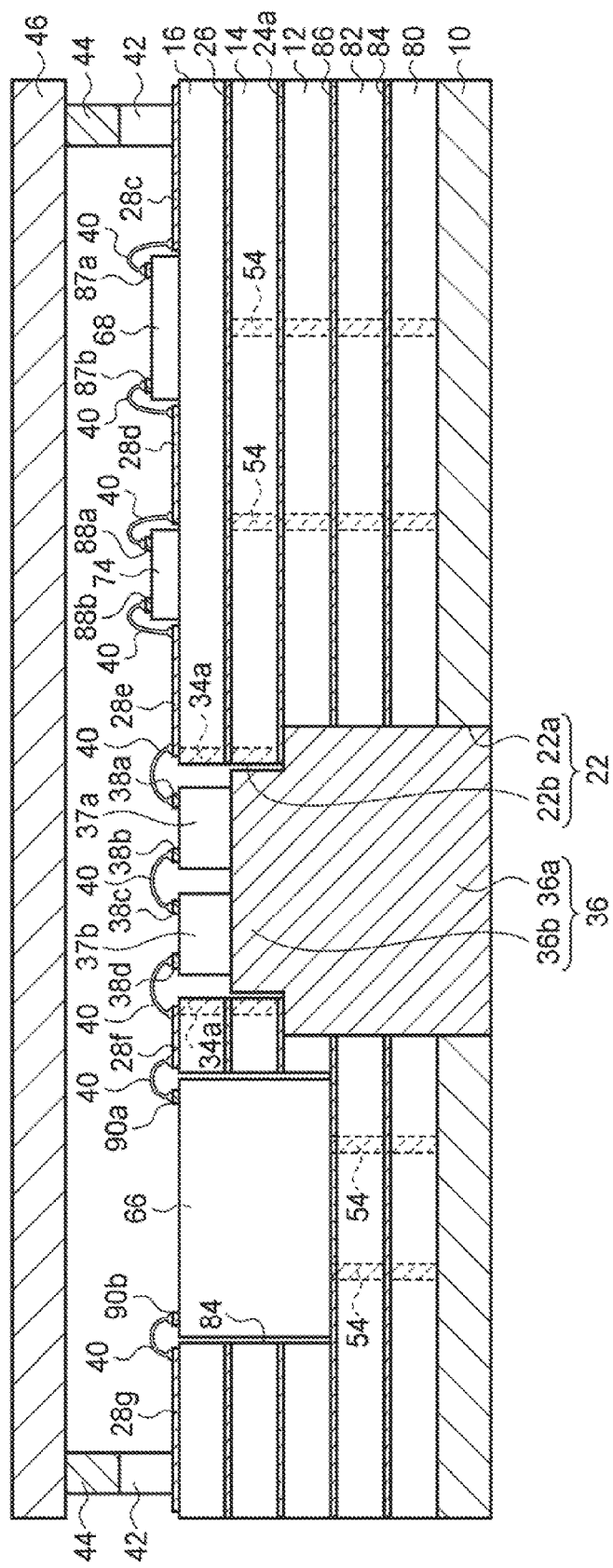
FIG. 24 is a sectional view of the electronic device according to the fourth embodiment.
Figure 25:
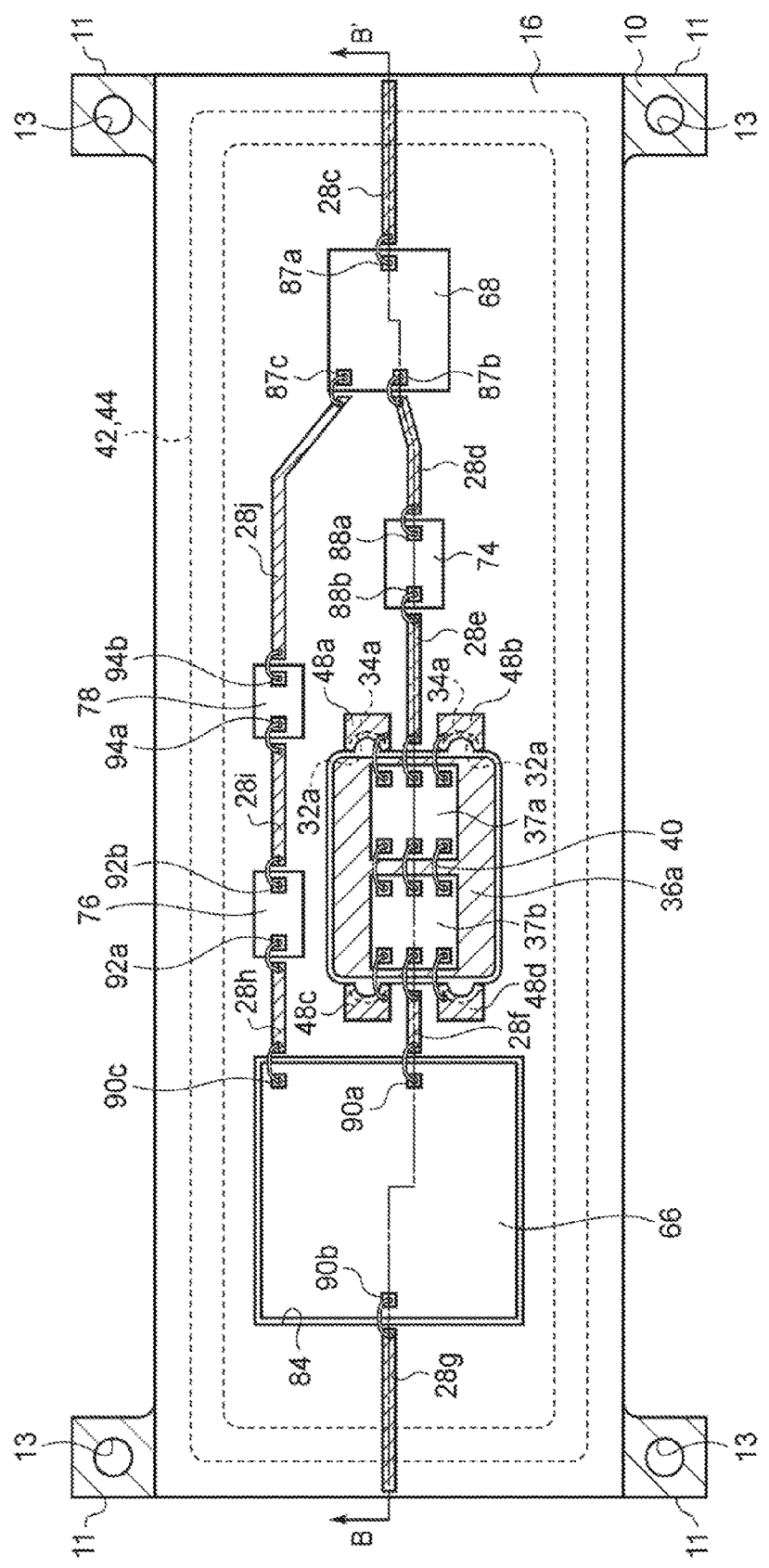
FIG. 25 is a plan view of the electronic device according to the fourth embodiment.

The electronic device according to a fourth embodiment will be described with reference to FIGS. 23 to 25. FIG. 23 is a block diagram of the circuit structure of the electronic device according to the present embodiment. FIG. 24 is a sectional view of the electronic device according to the present embodiment. FIG. 25 is a plan view of the electronic device according to the present embodiment. FIG. 24 corresponds to the B-B' line section of FIG. 25. The same members as those of the electronic device according to the first to the third embodiments illustrated in FIGS. 1A to 22B are represented by the same reference numbers not to repeat or to simplify the description.

The electronic device according to the present embodiment is applied to an MMIC (Monolithic Microwave Integrated Circuit) module.

As illustrated in FIG. 23, the electronic device according to the present embodiment includes a power amplifier 62, a low noise amplifier 64, a duplexer 66 and a signal control circuit (a phase shifter, a variable attenuator, a switch, a control circuit, a signal control unit) 68. The duplexer 66 is for switching transmission and receipt.

With the duplexer 66 set on the transmission side, a signal which has been inputted via a terminal 70 and processed by the signal control circuit 68 is amplified by the power amplifier 62 and reaches a terminal 72 via the duplexer 66. The terminal 72 is connected to, e.g., an antenna (not illustrated), and the signal amplified by the power amplifier 62 is transmitted via, e.g., the antenna.

With the duplexer 66 set on the side of the receipt, a received signal inputted via the outside output terminal 72 is amplified by the low noise amplifier 64 via the duplexer 66, is subjected to signal processing by the signal control circuit 68 and reaches the terminal 70. The terminal 70 is connected to, e.g., a signal processing circuit (a signal processing unit) not illustrated, and the signal subjected to the signal processing by the signal control circuit 68 is inputted to, e.g., a signal processing circuit.

The power amplifier 62 includes a preamplifier which amplifies a signal outputted from the signal control circuit 68, and an amplifier (an electronic element) 37a which further amplifies the signal amplified by the preamplifier 74, and a high output amplifier (an electronic element) 37b which further amplifies the signal amplified by the amplifier 76.

The low noise amplifier 64 includes a low noise amplifier 76 which amplifies a received signal and a high gain amplifier 78 which further amplifies the signal amplified by the low noise amplifier 76.

As illustrated in FIG. 24, on a base 10, a plurality of insulation layers 80, 82, 12, 14, 16 are formed. As the material of the insulation layers 80, 82, ceramics, for example, is used, as is the material of the insulation layers 12, 14, 16.

On the side of the upper surface of the first insulation layer 80, a ground conductor layer 84 and a power supply interconnection (not illustrated) are formed. The ground conductor layer 84 is formed on the entire surface of a region except regions where the power supply interconnection is formed in.

On the side of the upper surface of the second insulation layer 82, a ground conductor layer 86 is formed. The ground conductor layer 86 is formed on the entire surface of the region except regions where the vias (not illustrated) for the power supply interconnections are positioned.

On the side of the underside of the fourth insulation layer 14 (therebelow), the ground conductor layer 24a and the power supply interconnections (not illustrated) are formed. The ground conductor layer 24a is formed in a prescribed region containing the region where the opening 22 is formed.

On the side of the underside of the fifth insulation layer 16 (therebelow), the ground conductor layer 26 is formed. The ground conductor layer 26 is formed on the entire surface of the region except the region where the vias (not illustrated) for the power supply interconnections are positioned.

As illustrated in FIGS. 24 and 25, on the side of the upper surface of the fifth layer, i.e., the uppermost insulation layer 16 (thereabove), signal patterns 28a-28j and a power terminal (not illustrated) are formed.

On the insulation layer 16 near the opening 22, the ground conductor patterns 48a-48d are formed, as in the electronic device according to the second embodiment.

The partial opening 22a of a relatively large diameter penetrates the insulation layer 80, the insulation layer 82 and the insulation layer 12.

The partial opening 22b of a relatively small diameter penetrates the insulation layer 14 and the insulation layer 16.

A part of the ground conductor layer 24a positioned on the side of the underside of the fourth insulation layer 14 is exposed in the opening 22.

In the inside wall of the opening 22, as in the electronic device according to the third embodiment, the trenches 32a are formed (see FIGS. 21A and 21B). In the present embodiment, the trenches 32a are formed in the fourth insulation layer 14 and the fifth insulation layer 16. The parts of the trenches 32a formed in the insulation layer 14 and the parts of the trenches 32a formed in the insulation layer 16 are connected with each other. The longitudinal direction of the trenches 32a is perpendicular to the primary surface of the insulation layers 14, 16. As in the electronic device according to the second embodiment, the connection patterns (castellations, ground interconnections) 34a are formed in the trenches 32a. The connection patterns 34a interconnect the ground conductor layer 26 and the ground conductor layer 24a and are respectively connected to the ground conductor patterns 48a-48d.

The member 36, which functions as the ground conductor and the radiator, are connected to the side of the underside of the ground conductor layer 24a positioned on the side of the underside of the fourth insulation layer 14.

In the opening 22a penetrates the base 10, the member 36 and the base 10 are connected to each other with silver solder or others.

In the insulation layers 12, 14, 16, an opening 84 exposing the ground conductor layer 86 is formed. On the ground conductor layer 86 in the opening 84, the duplexer (an electronic element) 66 is positioned. The underside of the duplexer 66 is connected to the ground conductor layer 86 with, e.g., soldering or others. More specifically, the ground conductor (not illustrated) of the duplexer 66 is electrically connected to the conduction film (not illustrated) formed on the underside of the base (not illustrated) of the duplexer 66b, and the underside of the conduction film and the upper surface of the ground conductor layer 86 are jointed with soldering or others. As the material for jointing the underside of the duplexer 66 and the ground conductor 86, AuSn or others, for example, is used.

In the insulation layers 80, 82, 12, 14, the vias 54 are buried. The vias 54 electrically connect the base 10, the ground conductor layer 84, the ground conductor layer 86, the ground conductor layer 24a and the ground conductor layer 26. The vias 54 positioned below the duplexer 66 electrically connect the base 10, the ground conductor layer 84 and the ground conductor layer 86.

One end of a signal pattern 28c and the signal input/output terminal 87a of the signal control circuit 68 are connected to each other by, e.g., the bonding wire 40. The output terminal 87b of the signal control circuit 68 and one end of a signal pattern 28d are connected to each other by, e.g., the bonding wire 40.

The other end of the signal pattern 28d and the signal input terminal 88a of the preamplifier 74 are connected to each other by, e.g., the bonding wire 40. The signal output terminal 88b of the preamplifier 74 and one end of the signal pattern 28e are connected to each other by, e.g., the bonding wire 40.

The other end of the signal pattern 28e and the signal input terminal 38a of the amplifier 37a are connected to each other with, e.g., the bonding wire 40. The signal output terminal 38b of the amplifier 37b and one end of a signal pattern 28f are connected to each other with, e.g., the bonding wire 40.

The other end of the signal pattern 28f and the signal input terminal 90a of the duplexer 66 are connected to each other by, e.g., the bonding wire 40. The signal input/output terminal 90b of the duplexer 66 and one end of a signal pattern 28g are connected to each other by, e.g., the bonding wire 40. The signal output terminal 90c of the duplexer 66 and the other end of the signal pattern 28h are connected to each other by, e.g., the bonding wire 40.

The other end of the signal pattern 28h and the signal input terminal 92a of the amplifier 76 are connected to each other by, e.g., the bonding wire 40. The signal output terminal 92b of the amplifier 76 and one end of a signal pattern 28i are connected to each other by, e.g., the bonding wire 40.

The other end of the signal pattern 28i and the signal input terminal 92a of the amplifier 78 are connected to each other by, e.g., the bonding wire 40. The signal output terminal 94b of the amplifier 78 and one end of a signal pattern 28j are connected to each other by, e.g., the bonding wire 40.

The other end of the signal pattern 28j and the signal input terminal 87c of the signal control circuit 68 are connected to each other by, e.g., the bonding wire 40.

In the present embodiment as well, the power terminals 27a, 27b, the power supply interconnections 29a, 29b, 33a, 33b, the capacitor 43 and the vias 31, etc. described above in the first to the third embodiments are formed but not illustrated.

Thus, the electronic device according to the present embodiment is constituted.

As descried above, it is applicable to transmission reception devices, etc. of MMIC module, etc. According to the present embodiment, transmission reception devices, etc. which can realize the improvement of electric characteristics, such as increase of the bandwidth, decrease of the loss, etc. without impairing the reliability and the manufacturing yield can be provided.

Modified Embodiments

The present invention is not limited to the above-described embodiments and can cover other various modifications.

For example, in the first to the third embodiments, the substrate 2 with three layers of the insulation layers 12, 14, 16 formed on the base 10 is used. The total number of the insulation layers is not limited to three layers. For example, the total number of the insulation layers may be four or more. For example, in the first embodiment, the total number of the insulation layers is four, an insulation layer may be further formed between the base 10 and the insulation layer 12 or between the insulation layer 12 and the insulation layer 14.

In the above-described embodiments, CuW is used as the material of the member 36 which functions as the ground conductor and the radiator, but the material of the member 36 is not limited to CuW. For example, Cu, CuMo (copper molybdenum) or others may be used as the material of the member 36. As the material of the member 36, Cu mixed with diamond, Cu mixed with Ag, Cu mixed with Al or others may be used. Carbon nanotubes or others can be used as the material of the member 36.

In the above-described embodiments, the electronic devices 37a, 37b and the capacitors 43 are jointed to the member 36 with soldering, but this is not essential. For example, with a conductive adhesive or others, the electronic devices 37a, 37b and the capacitors 43 may be connected to the member 36.

In the above-described embodiments, the duplexer is jointed to the ground conductor layer 86 with soldering, but this is not essential. For example, the duplexer 66 may be connected to the ground conductor layer 86 with a conductive adhesive or others.

In the above-described embodiments, the member 36 and the base 10 are connected with silver solder, but this is not essential. For example, the member 36 and the base 10 may be connected to each other with a conductive adhesive or others.

In the above-described embodiments, as the material of the insulation layers 12, 14, 16, 80, 82, alumina ceramics is used, but this is not essential. For example, glass ceramics or others may be used as the material of the insulation layers 12, 14, 16, 80, 82. The multilayer wiring board of glass ceramics or others subjected to low temperature baking is called a low temperature baked ceramic multilayer wiring board, i.e., a LTCC (Low Temperature Co-fired Ceramics) substrate.

In the fourth embodiment, it is applied to the MMIC module, but this is not essential. For example, it may be applied to the hybrid IC or others.

In the above-described embodiments, the bonding wire 40 is used for the connection, but this is not essential. A bonding ribbon or others may be used for the connection.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
    a first ground conductor layer positioned at an underside of a first insulation layer;
    a second ground conductor layer positioned at an upper side of the first insulation layer;
    a second insulation layer positioned at an upper side of the second ground conductor layer;
    a first connection pattern formed on an inside wall of a first opening penetrating the first insulation layer and the second insulation layer and interconnecting the first ground conductor layer and the second ground conductor layer;
    a conductive member provided in the first opening and connected to the first ground conductor layer;
    an electronic element mounted on the member and grounded to the member; and
    a third insulation layer positioned at an underside of the first ground conductor layer and having a second opening whose opening dimension is larger than the first opening,
    the member being positioned in the first opening and the second opening,
    a part of the member positioned in the second opening having a larger diameter than the part of the member positioned in the first opening, and
    an upper surface of the part of the member positioned in the second opening being connected to the underside of the first ground conductor layer.

2. An electronic device according to claim 1, further comprising
    a first ground conductor pattern formed on the second insulation layer near the first opening,
    the first connection pattern being connected further to the first ground conductor pattern.

3. An electronic device according to claim 1, further comprising:
    a second ground conductor pattern formed on the second insulation layer at an edge of the second insulation layer; and
    a second connection pattern formed on a side wall of the first insulation layer and the second insulation layer and interconnecting the second ground conductor layer and the second ground conductor pattern.

4. An electronic device according to claim 2, further comprising
    a signal pattern formed on the second insulation layer,
    the first ground conductor pattern being formed along a part of the signal pattern.

5. An electronic device according to claim 1, further comprising
    a via interconnecting the first ground conductor layer and the second ground conductor layer.

6. An electronic device according to claim 3, further comprising
    a conductive base positioned below the first insulation layer,
    the second connection pattern being connected further to the base.

7. An electronic device according to claim 5, further comprising a conductive base positioned below the first insulation layer, the via being connected to the base.

8. An electronic device according to claim 1, wherein the first connection pattern is formed in a trench formed in the inside wall of the first opening.

9. An electronic device according to claim 3, wherein the second connection pattern is formed in a trench formed in the side wall of the first insulation layer and the second insulation layer.

10. An electronic device according to claim 1, wherein the member is formed of a metal.

11. An electronic device according to claim 6, wherein the base is formed of a metal.

12. An electronic device according to claim 1, wherein the first insulation layer and the second insulation layer are formed of ceramics.

\* \* \* \* \*